United States Patent
Yamashita et al.

(10) Patent No.: US 9,614,130 B2
(45) Date of Patent: Apr. 4, 2017

(54) LIGHT EMITTING DEVICE AND ILLUMINATION DEVICE

(71) Applicant: Sharp Kabushiki Kaisha, Osaka-shi, Osaka (JP)

(72) Inventors: Atsushi Yamashita, Osaka (JP); Masatsugu Masuda, Osaka (JP); Toyonori Uemura, Osaka (JP); Masanobu Okano, Osaka (JP); Masayuki Ohta, Osaka (JP)

(73) Assignee: Sharp Kabushiki Kaisha, Sakai (JP)

( * ) Notice: Subject to any disclaimer, the term of this patent is extended or adjusted under 35 U.S.C. 154(b) by 0 days.

(21) Appl. No.: 15/034,649

(22) PCT Filed: Oct. 7, 2014

(86) PCT No.: PCT/JP2014/076784
§ 371 (c)(1),
(2) Date: May 5, 2016

(87) PCT Pub. No.: WO2015/068513
PCT Pub. Date: May 14, 2015

(65) Prior Publication Data
US 2016/0276549 A1    Sep. 22, 2016

(30) Foreign Application Priority Data
Nov. 8, 2013    (JP) .................. 2013-232378

(51) Int. Cl.
H01L 33/50    (2010.01)
H05B 37/02    (2006.01)
(Continued)

(52) U.S. Cl.
CPC ........ *H01L 33/504* (2013.01); *H01L 25/0753* (2013.01); *H01L 33/56* (2013.01);
(Continued)

(58) Field of Classification Search
None
See application file for complete search history.

(56) References Cited

U.S. PATENT DOCUMENTS

2006/0169986 A1    8/2006  Radkov et al.
2006/0169998 A1    8/2006  Radkov et al.
(Continued)

FOREIGN PATENT DOCUMENTS

JP    2005-255895 A    9/2005
JP    2006-16413 A    1/2006
(Continued)

OTHER PUBLICATIONS

Official Communication issued in International Patent Application No. PCT/JP2014/076784, mailed on Dec. 9, 2014.

*Primary Examiner* — Daniel Whalen
(74) *Attorney, Agent, or Firm* — Keating & Bennett, LLP

(57) ABSTRACT

A light emitting device which emits a secondary light with high color purity and has a fast response speed is obtained. A KSF phosphor (15) which absorbs a part of blue light and emits red light and a CASN phosphor (16) are distributed in a resin (14) which seals an LED chip (13) which emits the blue light. The KSF phosphor (15) absorbs the blue light and emits the red light by forbidden transition, and the CASN phosphor (16) absorbs the blue light and emits the red light by allowed transition.

10 Claims, 11 Drawing Sheets

(51) Int. Cl.
*H01L 25/075* (2006.01)
*H01L 33/56* (2010.01)

(52) U.S. Cl.
CPC ........ *H05B 37/02* (2013.01); *H01L 2933/005* (2013.01); *H01L 2933/0033* (2013.01); *H01L 2933/0041* (2013.01)

(56) References Cited

U.S. PATENT DOCUMENTS

| | | |
|---|---|---|
| 2006/0226759 A1 | 10/2006 | Masuda et al. |
| 2007/0108896 A1 | 5/2007 | Hirosaki |
| 2007/0114562 A1 | 5/2007 | Radkov et al. |
| 2007/0205712 A1 | 9/2007 | Radkov et al. |
| 2008/0303409 A1 | 12/2008 | Hirosaki |
| 2010/0091215 A1 | 4/2010 | Fukunaga et al. |
| 2011/0043101 A1* | 2/2011 | Masuda ............. C09K 11/0883 313/503 |
| 2013/0264937 A1 | 10/2013 | Sakuta et al. |
| 2015/0357532 A1* | 12/2015 | Onuma ............... C09K 11/7708 257/98 |
| 2016/0062023 A1* | 3/2016 | Itoh ...................... G02B 6/0068 362/608 |
| 2016/0079211 A1* | 3/2016 | Konishi ............. H01L 25/0753 438/27 |

FOREIGN PATENT DOCUMENTS

| | | |
|---|---|---|
| JP | 2007-49114 A | 2/2007 |
| JP | 2009-528429 A | 8/2009 |
| JP | 2010-93132 A | 4/2010 |
| JP | 2012-104814 A | 5/2012 |
| WO | 2009/110285 A1 | 9/2009 |
| WO | 2012/121304 A1 | 9/2012 |

* cited by examiner

PWM PERIOD : 8.33ms (120Hz)
PWM Duty : 25%
RATIO OF AMOUNT OF LIGHT BETWEEN KSF AND CASN  50%:50%

|  | PWM SIGNAL | | | |
| --- | --- | --- | --- | --- |
|  | STATE (1) | STATE (2) | STATE (3) | STATE (4) |
| LED CHIP 43 | H LEVEL | L LEVEL | H LEVEL | L LEVEL |
| LED CHIP 44 | L LEVEL | H LEVEL | H LEVEL | L LEVEL |

PWM PERIOD : 8.33ms (120Hz)
PWM Duty : 25%
AMOUNT OF LIGHT OF KSF  100%

PWM PERIOD : 8.33ms (120Hz)
PWM Duty : 25%
RATIO OF AMOUNT OF LIGHT BETWEEN KSF AND "PSEUDO PHOSPHOR
HAVING AFTERGLOW TIME ASSUMED TO BE 100μs"  50%:50%

LIGHT EMITTING DEVICE AND ILLUMINATION DEVICE

TECHNICAL FIELD

The present invention relates to a light emitting device and an illumination device.

BACKGROUND ART

For a backlight used in a so-called liquid crystal television (TV), an LED chip which emits blue light as primary light, a red phosphor which is excited by the blue light and emits red light as secondary light, and a green phosphor which emits green light are used. The backlight emits white light which is obtained by mixing blue light, green light, and red light.

PTL 1 discloses a light emitting element which emits white light by exciting, using an LED for emitting blue light, divalent Eu-activated $CaAlSiN_3$ (hereinafter, referred to as CASN phosphor) which is a nitride-based phosphor for emitting red light, and a green phosphor that emits green light.

In addition, an Eu-activated β-type SiAlON phosphor disclosed in, for example, PTL 2 has been appropriately used in the related art as a phosphor which emits green light.

In a case where an illumination device which emits white light by combining a blue LED, a red phosphor, and a green phosphor is used as a light source of a backlight of a liquid crystal television, there is a tendency for color reproducibility of the liquid crystal television to be improved by using a phosphor having a narrower peak wavelength of a light spectrum.

However, in a case where the CASN phosphor which is a phosphor disclosed in PTL 1 is used, a wavelength width of the light spectrum of the red phosphor is equal to or greater than 80 nm, and thus, the color reproducibility of red is not sufficient.

Accordingly, in order to realize a display device such as a liquid crystal television which can display deep red, development of a backlight which uses a $Mn^{4+}$-activated $K_2SiF_6$ phosphor (hereinafter, referred to as KSF phosphor) disclosed in PTL 3 is in progress. A KSF phosphor has a spectrum of peak wavelength narrower than that of a CASN phosphor and can have further improved color reproducibility than the related art.

CITATION LIST

Patent Literature

PTL 1: Japanese Unexamined Patent Application Publication No. 2006-16413 (published on Jan. 19, 2006)

PTL 2: Japanese Unexamined Patent Application Publication No. 2005-255895 (published on Sep. 22, 2005)

PTL 3: Japanese Unexamined Patent Application Publication No. 2010-93132 (published on Apr. 22, 2010)

PTL 4: International Publication No. WO2009/110285 (published on Sep. 11, 2009)

PTL 5: Japanese Unexamined Patent Application Publication No. 2009-528429 (translation of PCT Application published on Aug. 6, 2009)

PTL 6: Japanese Unexamined Patent Application Publication No. 2007-49114 (published on Feb. 22, 2007)

SUMMARY OF INVENTION

Technical Problem

Here, the majority of liquid crystal televisions display images at 60 Hz, 120 Hz, or 240 Hz which is an integer multiple of a frame frequency of a video signal. It is possible to realize a display in which an unwanted image is not shown to a user by temporarily extinguishing a backlight based on the fact that an LED can be illuminated or extinguished at a high speed.

For example, an afterimage is reduced by temporarily extinguishing a backlight, while an image of the next frame is redisplayed on a liquid crystal screen. In addition, in a three-dimensional (3D) display of a frame sequential method by which an image for the right eye and an image for the left eye are alternately displayed, the backlight is temporarily extinguished until the images are displayed on the entire screen, and thus, it is possible to perform a function in which video that is obtained by mixing images of the right eye and the left eye is not shown.

In a case where this function is performed, a pulse width modulation (PWM) drive method in which illumination and extinguishing are repeated is used as an LED drive method used for a backlight, but timing of the illumination and extinguishing is synchronized with a display of a liquid crystal panel, and thus, a PWM period becomes 60 Hz, 120 Hz, or 240 Hz which is an integer multiple of the frame frequency of the video signal.

If the red phosphor (KSF phosphor) described in PTL 3 is used, color reproducibility by obtaining light having a narrow spectrum can be improved, but the KSF phosphor has a time (also referred to as afterglow time) of approximately 10 [ms] which is the time taken for the light intensity to become 1/e (e is a natural logarithm base) and is approximately 100 to 1000 times longer than the afterglow time of a CASN phosphor.

Accordingly, in a case where an LED is illuminated or extinguished at a dimming frequency (PWM dimming) synchronized with a display of a liquid crystal panel, even at timing in which blue light having a rectangular waveform from an LED chip of the LED is extinguished, as illustrated in FIG. 17, there is an afterglow of red light from a KSF phosphor which is excited by blue light from the LED chip and emits light. Due to the afterglow of red light from the KSF phosphor, an abnormality such as a phenomenon in which a displayed image is shown in color or a phenomenon in which images for the right eye and the left eye are mixed to be shown at the time of a 3D display, that is, a so-called crosstalk phenomenon, occurs. For example, this crosstalk occurs remarkably in an image or the like in which telop characters flow on the screen, and a part of the telop is shown in red.

FIG. 17 illustrates a response waveform of the KSF phosphor when a backlight having a PWM drive frequency of 120 Hz and a duty of 20% is driven.

The present invention is to solve the above problems, and an objective thereof is to obtain a light emitting device which emits the secondary light with high color purity and has a fast response speed and to obtain an illumination device.

Solution to Problem

According to an aspect of the present invention, a light emitting device includes a light emitting element which emits primary light; a resin which seals the light emitting element; and first and second phosphors which are distributed in the resin, absorb a part of the primary light, and emit secondary light having a wavelength longer than that of the primary light. The first phosphor absorbs the primary light and emits the secondary light by forbidden transition, and the second phosphor absorbs the primary light and emits the secondary light by allowed transition.

Advantageous Effects of Invention

According to an aspect of the present invention, it is possible to obtain a light emitting device which emits the secondary light with high color purity and has a fast response speed.

DESCRIPTION OF EMBODIMENTS

Embodiment 1

Configuration of Illumination Device 1

First, the illumination device 1 which uses an LED (light emitting device) 11 according to the present embodiment will be described. FIG. 2(a) is an expanded plan view illustrating a part of the illumination device 1 which uses the LED 11 according to Embodiment 1, and FIG. 2(b) is a sectional view of the illumination device 1 illustrated in FIG. 2(a).

Figure 2:
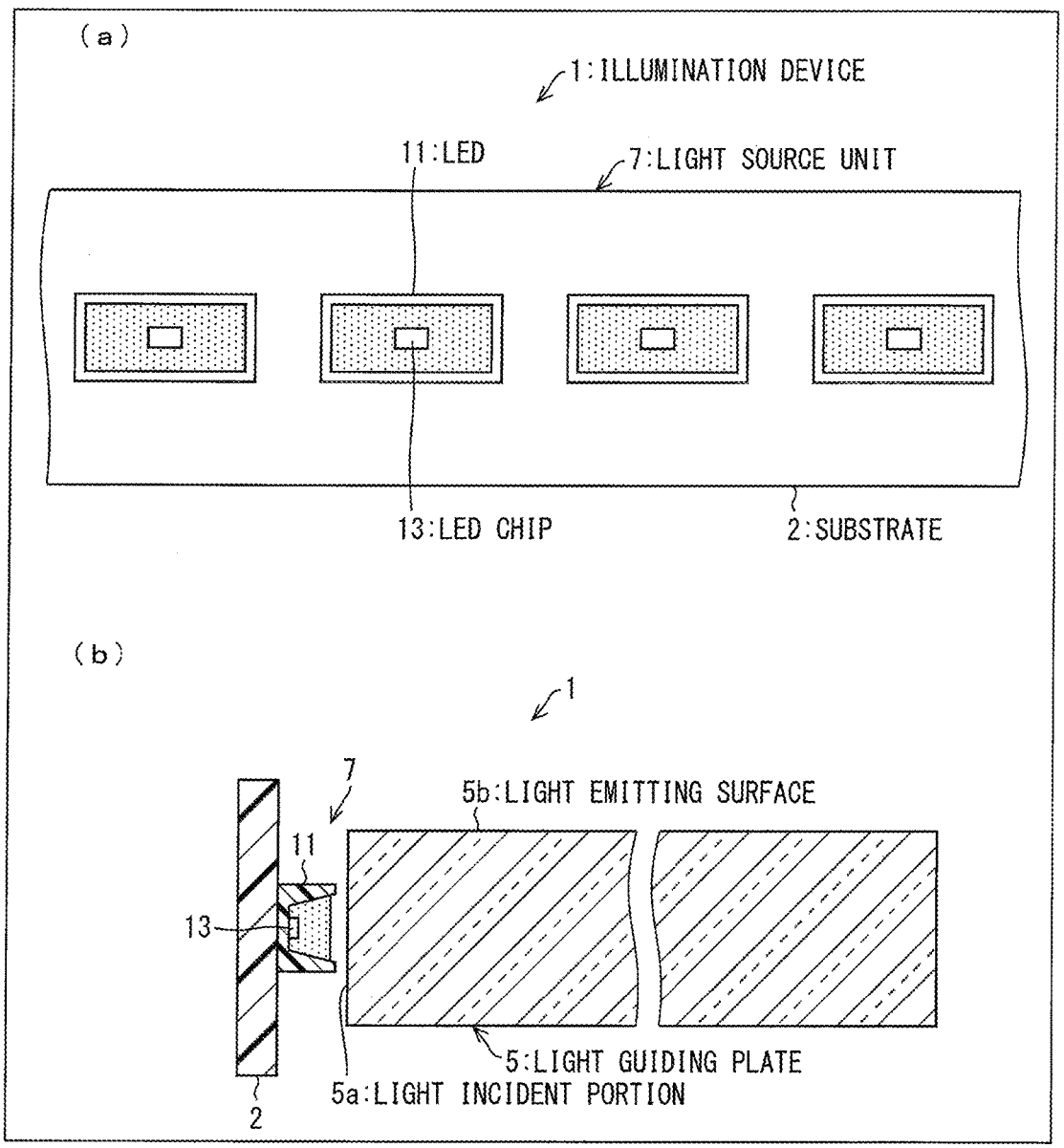
FIG. 2(a) is an expanded plan view illustrating a part of the illumination device which uses the LED according to Embodiment 1.
FIG. 2(b) is a sectional view of the illumination device illustrated in FIG. 2(a).

As illustrated in FIGS. 2(a) and 2(b), the illumination device 1 includes a substrate 2, multiple LEDs 11 and a light guiding plate 5. The illumination device 1 also includes an LED drive control unit (refer to FIG. 3), which is not illustrated in FIG. 2, for controlling driving of multiple LEDs 11.

The light guiding plate 5 has a rectangular shape overall and is a transparent member having a predetermined thickness. The light guiding plate 5 has a structure in which light is emitted from each portion of a light emitting surface 5b such that light which is incident from a light incident portion 5a is emitted in a planar form, and the light guiding plate 5 is formed of a transparent material such as acryl. In addition, an end surface on a side of the light guiding plate 5 functions as the light incident portion 5a on which light is incident.

The substrate 2 is formed as an elongated rectangle (strip shape). In the substrate 2, printed wires (not illustrated) through which power is transferred to the LED 11 are formed on a mounting surface on which multiple LEDs 11 are mounted. In addition, a positive terminal (not illustrated) and a negative terminal (not illustrated) which are coupled to the printed wires are provided at both end portions or one end portion of the substrate 2. Wires through which power is supplied from the outside are coupled to the positive terminal and the negative terminal, and thereby the LED 11 receives power.

The multiple LEDs 11 are mounted in a line on the substrate 2 in a longitudinal direction of the substrate 2. The multiple LEDs 11 are coupled in series in a longitudinal direction of the substrate 2.

A light source unit 7 is formed by the substrate 2 and the LED 11. In the light source unit 7, a light emitting surface of each of the multiple LEDs 11 faces the light incident portion 5a such that light emitted from an LED chip (light emitting element) 13 of each of the multiple LEDs 11 is incident on the light incident portion 5a of the light guiding plate 5, and the light source unit 7 is disposed at a location close to the light guiding plate 5.

(Configuration of LED 11)

Figure 1:
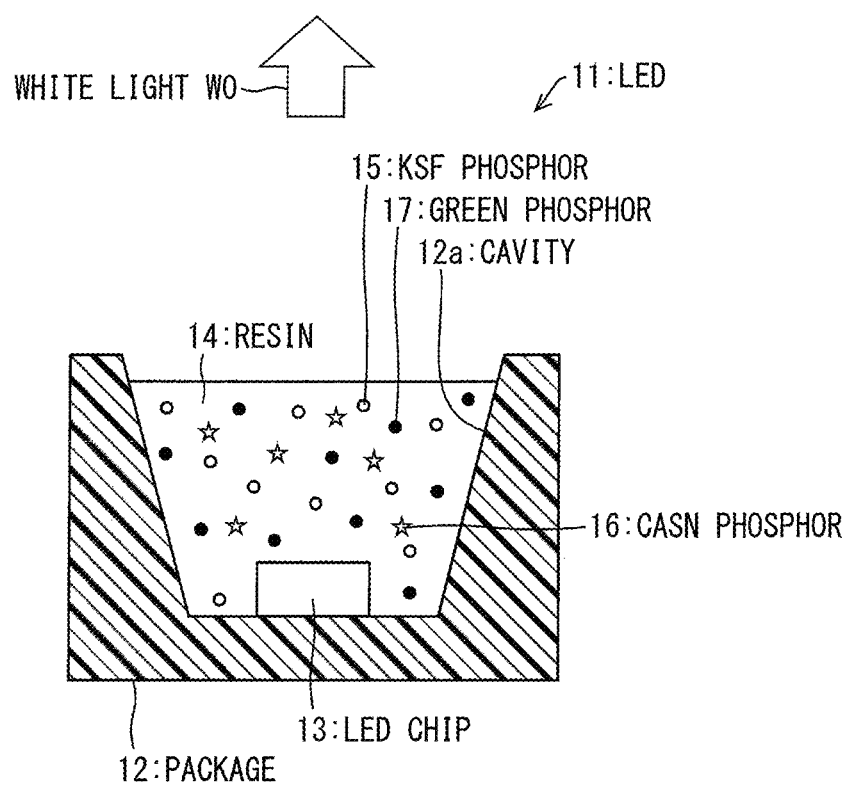
FIG. 1 is a sectional view of an LED in an illumination device according to Embodiment 1.

A configuration of the LED 11 will be described in detail with reference to FIG. 1 and FIG. 2. FIG. 1 is a sectional view of the LED 11 in the illumination device 1.

As illustrated in FIG. 2(a), the LED 11 has a light emitting surface having a rectangular shape as an example, and the LED chip 13 is mounted in the center. In addition, as illustrated in FIG. 1, the LED 11 includes a package 12, the LED chip 13, a resin 14, a KSF phosphor (first phosphor) 15, a CASN phosphor (second phosphor) 16, and a green phosphor 17.

The package 12 has a cavity (concave portion) 12a which is a concave portion. The cavity 12a is a space which is provided in the package 12 such that the LED chip 13 is mounted on a bottom surface in the concave portion and a side surface of the concave portion is used as a reflecting surface. The package 12 is formed of a nylon-based material and is provided by insert molding such that a lead frame, which is not illustrated, is exposed on the bottom surface of the cavity 12a of the package 12. The lead frame is divided into two parts at an exposed portion.

The package 12 includes a reflecting surface which forms an inner side surface of the cavity 12a which is a concave portion. It is preferable that the reflecting surface is formed of a metal film with high reflectance including Ag or Al, or white silicone, such that light which is emitted from the LED chip 13 is reflected to the outside of the LED 11.

The LED chip 13 is, for example, a gallium nitride (GaN)-based semiconductor light emitting element containing a conductive substrate, and while not illustrated, a bottom surface electrode is formed on a bottom surface of the conductive substrate and an upper electrode is formed on a reverse surface thereof. The emitted light (primary light) of the LED chip 13 is blue light in a range of 430 nm to 480 nm and has a peak wavelength in the vicinity of 450 nm.

The LED chip 13 (blue LED chip) is die-bonded to one side of the exposed portion in the lead frame by a material having low conductivity. Furthermore, in the LED chip 13, the upper electrode of the LED chip 13 and the other side of the exposed portion in the lead frame are die-bonded by a wire, which is not illustrated. In this way, the LED chip 13 is electrically coupled to the lead frame. Here, the LED chip respectively having electrodes on the upper surface and a lower surface is described, but it is also possible to use an LED having two electrodes on the upper surface.

The cavity 12a is filled with the resin 14, and thereby the cavity 12a in which the LED chip 13 is disposed is sealed. In addition, since the resin 14 needs to have high durability with respect to primary light with a long wavelength, a silicone resin is appropriately used. A surface of the resin 14 forms a light emitting surface from which light is emitted.

A first phosphor and a second red phosphor which are excited by first light emitted from the LED chip 13 are two types of red phosphor and emit red light, and a green phosphor 17 which is excited by the first light that is emitted from the LED chip 13, are distributed in the resin 14 as secondary light. The first red phosphor is a phosphor (hereinafter, there is a case of being referred to as a phosphor of a forbidden transition type) which emits red light by forbidden transition, and the second red phosphor is a phosphor (hereinafter, there is a case of being referred to as a phosphor of an allowed transition type) which emits red light by allowed transition. The red phosphors distributed in the resin 14 may be at least the phosphor of a forbidden transition type and the phosphor of an allowed transition type of two types and may be red phosphors of three types or more. In addition, the green phosphor 17 may or may not be distributed in the resin 14 as necessary.

The KSF phosphor 15 is distributed in the resin 14 and is an example of the first red phosphor which emits red light by the forbidden transition. The KSF phosphor 15 is excited by blue light which is a primary light and emits red (peak wavelength is equal to or longer than 600 nm and is equal to or shorter than 780 nm) secondary light having a wavelength longer than that of the primary light. The KSF phosphor 15 is a phosphor having a $Mn^{4+}$-activated $K_2SiF_6$ structure.

The KSF phosphor 15 emits red light which has a wavelength width of peak wavelength that is narrowed to approximately 30 nm or less and has high purity.

The afterglow time of the KSF phosphor 15 which is the time required for the light intensity of secondary light from the KSF phosphor 15 to become 1/e (e is a natural logarithm base) when primary light from the LED chip 13 is extinguished, is approximately 7 ms to 8 ms. In addition, in order for the secondary light from the KSF phosphor 15 to be almost completely on or extinguished, approximately 10 ms is needed.

The first red phosphor (first phosphor) which is distributed in the resin 14 may be a phosphor which emits red light by forbidden transition. Particularly, it is preferable that the first red phosphor is formed of a phosphor material having a narrow spectrum of wavelength width of peak wavelength equal to or narrower than 30 nm.

In addition to the phosphor having the $Mn^{4+}$-activated $K_2SiF_6$ structure, a $Mn^{4+}$-activated Mg fluorogermanate phosphor or the like can be used as a material which can be used as the first red phosphor having a narrow wavelength width of peak wavelength. Furthermore, the first red phosphor which emits red light by forbidden transition may be one of the $Mn^{4+}$-activated complex fluoride phosphors represented by following general formulas (A1) to (A8)

$$A_2[MF_5]:Mn^{4+} \quad \text{general formula (A1)}$$

(in the above general formula (A1), A is selected from any one of Li, Na, K, Rb, Cs, and NEU or from a combination of these, and M is selected from any one of Al, Ga, and In or from a combination of these)

$$A_3[MF_6]:Mn^{4+} \quad \text{general formula (A2)}$$

(in the above general formula (A2), A is selected from any one of Li, Na, K, Rb, Cs, and NEU or from a combination of these, and M is selected from any one of Al, Ga, and In or from a combination of these)

$$Zn_2[MF_7]:Mn^{4+} \quad \text{general formula (A3)}$$

(in the above general formula (A3), M in [ ] is selected from any one of Al, Ga, and In or from a combination of these)

$$A[In_2F_7]:Mn^{4+} \quad \text{general formula (A4)}$$

(in the above general formula (A4), A is selected from any one of Li, Na, K, Rb, Cs, and $NH_4$ or from a combination of these)

$$A_2[MF_6]:Mn^{4+} \quad \text{general formula (A5)}$$

(in the above general formula (A5), A is selected from any one of Li, Na, K, Rb, Cs, and $NH_4$, or from a combination of these, and M is selected from any one of Ge, Si, Sn, Ti, and Zr or from a combination of these)

$$E[MF_6]:Mn^{4+} \quad \text{general formula (A6)}$$

(in the above general formula (A6), E is selected from any one of Mg, Ca, Sr, Ba, and Zn or from a combination of these, and M is selected from any one of Ge, Si, Sn, Ti, and Zr or from a combination of these)

$$Ba_{0.65}Zr_{0.35}F_{2.70}:Mn^{4+} \quad \text{general formula (A7)}$$

$$A_3[ZrF_7]:Mn^{4+} \quad \text{general formula (A8)}$$

(in the above general formula (A8), A is selected from any one of Li, Na, K, Rb, Cs, and $NH_4$ or from a combination of these)

Furthermore, the first red phosphor which is distributed in the resin 14 may be a tetravalent manganese-activated fluoride tetravalent metal salt phosphor in actuality represented by, for example, the following general formula (A9) or the general formula (A10), in addition to being the phosphor having the $Mn^{4+}$-activated $K_2SiF_6$ structure.

$$MII_2(MIII_{1-h}Mn_h)F_6 \qquad \text{general formula (A9)}$$

In the general formula (A9), MII indicates at least one type of Alkali metal element which is selected from Li, Na, K, Rb, and Cs, and it is preferable that MII is K with regard to brightness and stability of powder characteristics. In addition, in the general formula (A9), MIII indicates at least one type of tetravalent metal element which is selected from Ge, Si, Sn, Ti, and Zr, and it is preferable that MIII is Ti with regard to brightness and stability of powder characteristics.

In the general formula (A9), a value of h which indicates a composition ratio (concentration) of Mn is $0.001 \leq h \leq 0.1$. In a case where the value of h is less than 0.001, there is an abnormality of sufficient brightness being not obtained. In addition, in a case where the value of h exceeds 0.1, there is an abnormality of brightness being significantly reduced due to concentration quenching or the like. It is preferable that the value of h is $0.005 \leq h \leq 0.5$ with regard to brightness and stability of powder characteristics.

Specifically, $K_2(Ti_{0.99}Mn_{0.01})F_6$, $K_2(Ti_{0.9}Mn_{0.1})F_6$, $K_2(Ti_{0.999}Mn_{0.001})F_6$, $Na_2(Zr_{0.98}Mn_{0.02})F_6$, $CS_2(Si_{0.95}Mn_{0.05})F_6$, $Cs_2(Sn_{0.98}Mn_{0.02})F_6$, $K_2(Ti_{0.88}Zr_{0.10}Mn_{0.02})F_6$, $Na_2(Ti_{0.75}Sn_{0.20}Mn_{0.05})F_6$, $CS_2(Ge_{0.999}Mn_{0.001})F_6$, $(K_{0.80}Na_{0.20})_2(Ti_{0.69}Ge_{0.30}Mn_{0.01})F_6$, or the like can be used as the first red phosphor which is represented by the general formula (A9), but the first red phosphor is not limited to this.

$$MIV(MIII_{1-h}Mn_h)F_6 \qquad \text{general formula (A10)}$$

In the general formula (A10), MIII indicates at least one type of tetravalent metal element which is selected from Ge, Si, Sn, Ti, and Zr, as well as MIII in the aforementioned general formula (A9), and it is preferable that MIII is Ti for the same reason. In addition, in the general formula (A10), MIV indicates at least one type of alkali earth metal element which is selected from Mg, Ca, Sr, Ba, and Zn, and it is preferable that MIV is Ca with regard to brightness and stability of powder characteristics. In addition, in the general formula (A10), a value of h which indicates a composition ratio (concentration) of Mn is $0.001 \leq h \leq 0.1$ in the same manner as in the aforementioned general formula (A9), and for the same reason, it is preferable that the value of h is $0.005 \leq h \leq 0.5$.

Specifically, $Zn(Ti_{0.98}Mn_{0.02})F_6$, $Ba(Zr_{0.995}Mn_{0.005})F_6$, $Ca(Ti_{0.995}Mn_{0.005})F_6$, $Sr(Zr_{0.98}Mn_{0.02})Fe$, or the like can be used as the first red phosphor which is represented by the general formula (A10), but the first red phosphor is not limited to this.

The CASN phosphor 16 is distributed in the resin 14 and is an example of the second red phosphor which emits red light by allowed transition. The CASN phosphor 16 is excited by blue light which is a primary light and emits red (peak wavelength is equal to or longer than 600 nm and is equal to or shorter than 780 nm) secondary light having a wavelength longer than that of the primary light. The CASN phosphor 16 is a phosphor having a divalent Eu-activated $CaAlSiN_3$ structure.

The CASN phosphor 16 has a wavelength width of peak wavelength greater than that of the KSF phosphor 15. However, the afterglow time of the CASN phosphor 16 which is the time required for the light intensity of secondary light from the CASN phosphor 16 to become 1/e (e is a natural logarithm base) when primary light from the LED chip 13 is extinguished is approximately 1 μs to 10 μs. The CASN phosphor 16 has a response speed faster than that of the KSF phosphor 15.

Since the afterglow time of the KSF phosphor 15 (first phosphor) is approximately 10 ms, the afterglow of the CASN phosphor 16 (second phosphor) is 1/10000 to 1/1000 of the afterglow time of the KSF phosphor. That is, the response speed of the second phosphor is equal to or faster than 1000 times the response speed of the first phosphor, and it is preferable that the response speed of the second phosphor is equal to or faster than 10000 times the response speed of the first phosphor.

A material which can be used for the second red phosphor may be a divalent Eu-activated nitride phosphor in actuality represented by the following general formula (B1), in addition to the phosphor having the divalent Eu-activated $CaAlSiN_3$ structure.

$$(XIII_{1-j}Eu_j)XIVSiN_3 \qquad \text{general formula (B1)}$$

In the general formula (B1), XIII indicates at least one type of element which is selected from Mg, Ca, Sr, and Ba, XIV indicates at least one type of element which is selected from Al, Ga, In, Sc, Y, La, Gd, and Lu, and j indicates a number which satisfies $0.001 \leq j \leq 0.05$.

Specifically, $(Ca_{0.98}Eu_{0.02})AlSiN_3$, $(Ca_{0.985}Eu_{0.015})AlSiN_3$, $(Ca_{0.94}Sr_{0.05}Eu_{0.01})AlSiN_3$, $(Ca_{0.99}Eu_{0.01})Al_{0.90}Ga_{0.10}SiN_3$, $(Ca_{0.98}Eu_{0.02})AlSiN_3$, $(Ca_{0.97}Ba_{0.01}Eu_{0.02})Al_{0.99}In_{0.01}SiN_3$, $(Ca_{0.98}Eu_{0.02})AlSiN_3$, $(Ca_{0.99}EU_{0.01})AlSiN_3$, or the like can be used as the second red phosphor which is represented by the general formula (B1), but the second red phosphor is not limited to this.

The green phosphor 17 (green phosphor) is distributed in the resin 14. The green phosphor 17 is a phosphor which is excited by blue light which is a primary light, and the green phosphor 17 emits green (peak wavelength is equal to or longer than 500 nm and is equal to or shorter than 550 nm) secondary light having a wavelength longer than that of the primary light.

The green phosphor 17 may be β-type SiAlON which is a divalent Eu-activated oxynitride phosphor represented by the following general formula (C1) or a divalent Eu-activated silicate phosphor represented by the following general formula (C2).

$$Eu_aSi_bAl_cO_dN_e \qquad \text{general formula (C1)}$$

In the general formula (C1), a value of a which indicates a composition ratio (concentration) of Eu is $0.005 \leq a \leq 0.4$. In a case where the value of a is less than 0.005, sufficient brightness is not obtained. In addition, in a case where the value of a exceeds 0.4, brightness is significantly reduced due to concentration quenching or the like. In addition, it is preferable that the value of a in the aforementioned general formula (C1) is $0.01 \leq a \leq 0.2$ with regard to stability of powder characteristics, and homogeneity of the basic material. In addition, in the general formula (C1), b indicating a composition ratio (concentration) of Si and c indicating a composition ratio (concentration) of Al are numbers which satisfy $b+c=12$, and d indicating a composition ratio (concentration) of O and e indicating a composition ratio (concentration) of N are numbers which satisfy $d+e=16$.

Specifically, $Eu_{0.05}Si_{11.50}Al_{0.50}O_{0.05}N_{15.95}$, $Eu_{0.10}Si_{11.00}Al_{1.00}O_{0.10}N_{15.90}$, $Eu_{0.30}Si_{9.80}Al_{2.20}O_{0.30}N_{15.70}$, $Eu_{0.15}Si_{10.00}Al_{2.00}O_{0.20}N_{15.80}$, $Eu_{0.01}Si_{11.60}Al_{0.40}O_{0.01}N_{15.99}$, $Eu_{0.005}Si_{11.70}Al_{0.30}O_{0.03}N_{15.97}$ or the like can be used as the green phosphor 17 which is represented by the general formula (C1), but the green phosphor 17 is not limited to this.

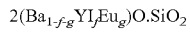   general formula (C2)

In the general formula (C2), YI indicates at least one type of Alkali earth metal element which is selected from Mg, Ca, and Sr, and it is preferable that YI is Sr in order to obtain highly efficient mother. In the general formula (C2), a value of f which indicates a composition ratio (concentration) of YI is $0<f\leq0.55$, and since the value of f is within a range thereof, it is possible to obtain green light in a range of 510 nm to 540 nm. In a case where the value of f exceeds 0.55, yellowish green light is emitted, and color purity is degraded. Furthermore, it is preferable that the value of f is within a range of $0.15\leq f\leq0.45$ from a viewpoint of efficiency and color purity. In addition, in the general formula (C2), a value of g which indicates a composition ratio (concentration) of Eu is $0.03\leq g\leq0.10$. In a case where a value of g is less than 0.03, sufficient brightness is not obtained. In a case where the value of g exceeds 0.10, brightness is significantly reduced due to concentration quenching or the like. In addition, it is preferable that the value of g is within a range of $0.04\leq g\leq0.08$ with regard to brightness and stability of powder characteristics.

Specifically, $2(Ba_{0.70}Sr_{0.26}Eu_{0.04}).SiO_2$, $2(Ba_{0.57}Sr_{0.38}Eu_{0.05})O.SiO_2$, $2(Ba_{0.53}Sr_{0.43}Eu_{0.04})O.SiO_2$, $2(Ba_{0.82}Sr_{0.15}Eu_{0.03})O.SiO_2$, $2(Ba_{0.46}Sr_{0.49}Eu_{0.05})O.SiO_2$, $2(Ba_{0.59}Sr_{0.35}Eu_{0.06})O.SiO_2$, $2(Ba_{0.52}Sr_{0.40}Eu_{0.08})O.SiO_2$, $2(Ba_{0.85}Sr_{0.10}Eu_{0.05})O.SiO_2$, $2(Ba_{0.47}Sr_{0.50}Eu_{0.03})O.SiO_2$, $2(Ba_{0.54}Sr_{0.36}Eu_{0.10})O.SiO_2$, $2(Ba_{0.69}Sr_{0.25}Ca_{0.02}Eu_{0.04})O.SiO_2$, $2(Ba_{0.56}Sr_{0.38}Mg_{0.01}Eu_{0.05})O.SiO_2$, $2(Ba_{0.81}Sr_{0.13}Mg_{0.01}Ca_{0.01}Eu_{0.04})O.SiO_2$ or the like can be used as the green phosphor 17 which is represented by the general formula (C2), but the green phosphor 17 is not limited to this.

In addition, the green phosphor 17 may be a divalent Eu-activated silicate phosphor which is represented by the following general formula (C3).

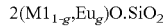   general formula (C3)

In the general formula (C3), M1 indicates at least one type of element which is selected from Mg, Ca, Sr, and Ba, and g indicates a number which satisfies $0.005\leq g\leq0.10$.

A so-called BOSE Alkali earth metal silicate phosphor which is represented by the general formula (C3) is a phosphor of an allowed transition type in which the afterglow time which is the time required for the light intensity to become 1/e is equal to or less than 10 μs, as well as the CASN phosphor.

In the LED 11 having the aforementioned configuration, the primary light (blue light) which is emitted from the LED chip 13 passes through the resin 14. A part thereof excites the KSF phosphor 15 thereby being converted into secondary light (red light), excites the CASN phosphor 16 thereby being converted into secondary light (red light), and excites the green phosphor 17 thereby being converted into secondary light (green light). In this way, white light W0, which is obtained by mixing the primary blue light and the secondary red and green light, is emitted from the LED 11 to the outside of the LED 11.

In the LED 11, a mixture ratio of the green phosphor 17 and the red phosphor (first red phosphor and second red phosphor) is not particularly limited, but it is preferable that the mixture ratio of the green phosphor 17 to the red phosphor is set to a range of 5% to 70% by weight ratio, and it is more preferable that the mixture is set to a range of 15% to 45%. In addition, the mixture ratio of the first red phosphor and the second red phosphor will be described below.

(Configuration of LED Drive Control Unit 1)

Figure 3:
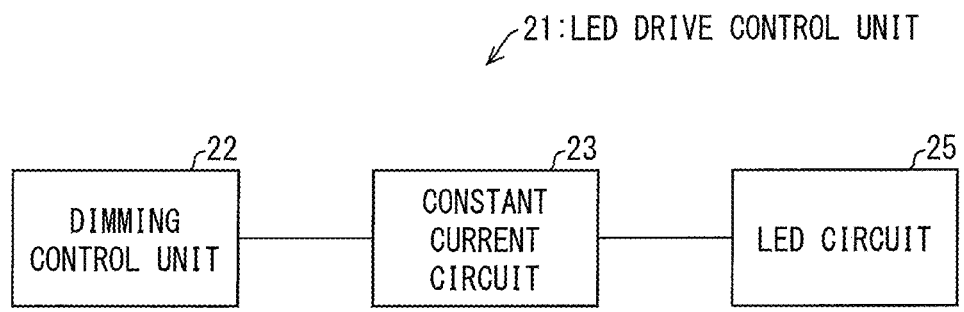
FIG. 3 is a block diagram illustrating a configuration of an LED drive control unit which controls driving of the LED.

FIG. 3 is a block diagram illustrating a configuration of an LED drive control unit 21 which controls driving of the LED 11. The illumination device 1 includes the LED drive control unit 21 illustrated in FIG. 3.

As illustrated in FIG. 3, the LED drive control unit 21 includes a dimming control unit (pulse width modulation signal generation means) 22, a constant current circuit 23, and an LED circuit 25. The LED circuit 25 is a series circuit of the LED chip 13 mounted on the substrate 2.

The dimming control unit 22 controls illumination time of the LED chip 13 of the LED circuit 25 according to PWM control. For this reason, the dimming control unit 22 includes a PWM circuit (not illustrated) which generates a PWM signal that is provided to the LED circuit 25. The PWM circuit changes a duty ratio of the PWM signal according to instruction from the outside.

The constant current circuit 23 generates a constant current which flows through the LED circuit 25, based on the PWM signal which is supplied from the dimming control unit 22. While the constant current circuit 23 is on during a period in which the PWM signal has an H level thereby supplying a constant current to the LED circuit 25, the constant current circuit 23 is off during a period in which the PWM signal has an L level thereby stopping supply of a constant current to the LED circuit 25.

In the LED drive control unit 21 having the aforementioned configuration, the constant current which is supplied from the constant current circuit 23 to the LED circuit 25 is controlled by the PWM signal which is controlled by the dimming control unit 22. By doing so, light intensity of the LED chip 13 is controlled.

(With Respect to Light Emission State and Mixture of Red Phosphor)

Figure 4:
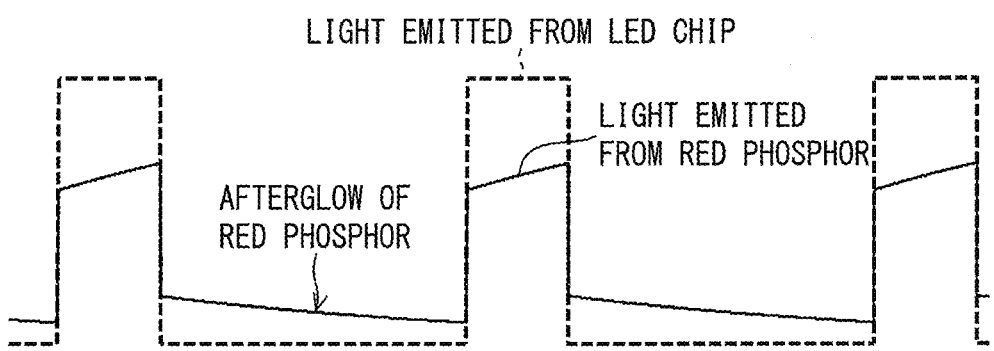
FIG. 4 is a diagram illustrating a light emission state of blue light and red light of the LED according to a PWM signal.

FIG. 4 is a diagram illustrating a light emission state of the blue light and the red light of the LED 11 according to the PWM signal. In FIG. 4, light emission of the LED chip represents a light emission state of the blue light which is emitted from the LED chip 13, and light emission of the red phosphor represents a light emission state of the red light that is emitted from the KSF phosphor 15 and the CASN phosphor 16 in which excitation emission is performed by the blue light emitted from the LED chip 13. In addition, a frequency and duty of the PWM signal which is supplied from the constant current circuit 23 to the LED circuit 25 are respectively 120 Hz and 20%, and a light intensity ratio between the KSF phosphor 15 and the CASN phosphor 16 is 50:50.

Figure 5:
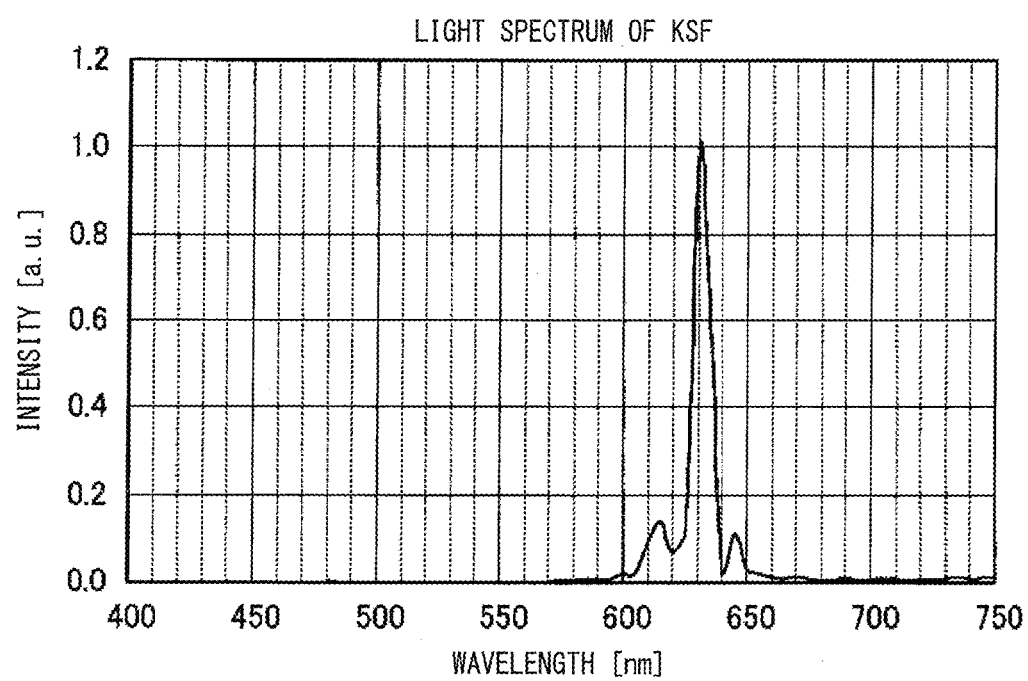
FIG. 5 is a diagram illustrating a light spectrum of a KSF phosphor.
Figure 6:
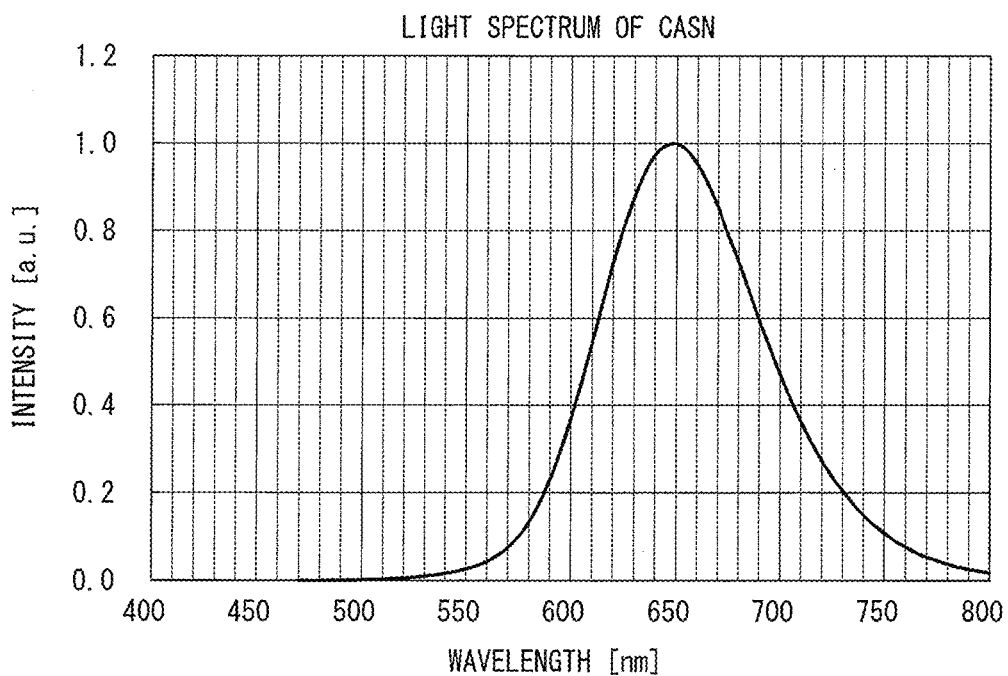
FIG. 6 is a diagram illustrating a light spectrum of a CASN phosphor.

FIG. 5 is a diagram illustrating a light spectrum of the KSF phosphor 15. FIG. 6 is a diagram illustrating a light spectrum of the CASN phosphor 16.

As illustrated in FIG. 4, the LED chip 13 emits light such that a square wave corresponding to on and off of the PWM signal is generated. In addition, it can be seen that a rising edge and a falling edge of the light emitted from the phosphor containing two types of phosphors which are the KSF phosphor 15 and the CASN phosphor 16 are steeper than a rising edge and a falling edge of the light emitted from the red phosphor composed of only the KSF phosphor illustrated in FIG. 17.

Figure 17:
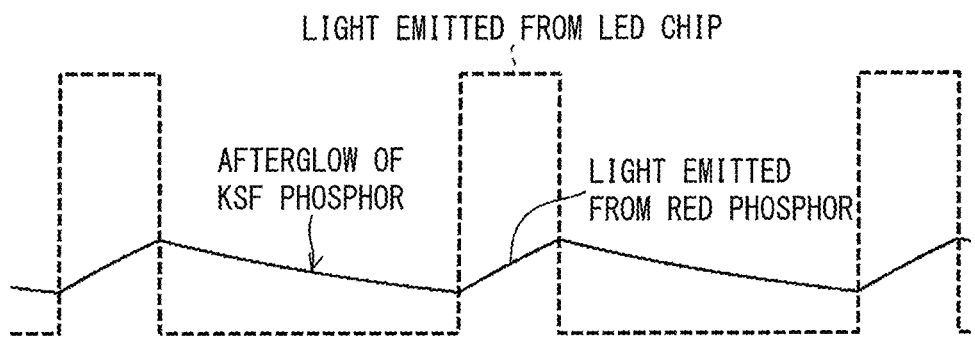
FIG. 17 is a diagram illustrating light emission states of blue light and red light of an LED according to the PWM signal in the LED of the related art which uses a KSF phosphor.

That is, it can be seen that after the light emission of the LED chip is off, the afterglow of the red phosphor containing two types of phosphors which are the KSF phosphor 15 and the CASN phosphor 16 illustrated in FIG. 4 is reduced more than that of the red phosphor composed of only the KSF phosphor illustrated in FIG. 17.

In a case where a light intensity ratio between the KSF phosphor 15 and the CASN phosphor 16 is KSF:CASN=50:50, a mixture ratio (weight %) of the respective phosphors distributed in the LED 11 is as follows.

KSF phosphor: 100
CASN phosphor: 13.7
Green phosphor: 75.7

In addition, the mixture ratio of the green phosphors needs to be appropriately changed by chromaticity of the LED chip 13.

As illustrated in FIG. 5 and FIG. 6, it can be seen that the KSF phosphor 15 which is a phosphor of a forbidden transition type has a narrow spectrum whose peak wavelength width near 630 nm is narrower than that of the CASN phosphor 16 which is a phosphor of an allowed transition type. It is preferable that a wavelength width of peak wavelength of the light spectrum is approximately equal to or less than 30 nm, like in the KSF phosphor 15. In this way, proportion including a wavelength band of color other than a wavelength band of red aiming to emit light is low in a light spectrum which is a spectrum having a narrow wavelength width of peak wavelength of a light spectrum. In addition, a wavelength band of red to be a target is more clearly separated from a wavelength band of color other than that. For this reason, it is possible to obtain the LED 11 with wide color reproducibility.

Figure 7:
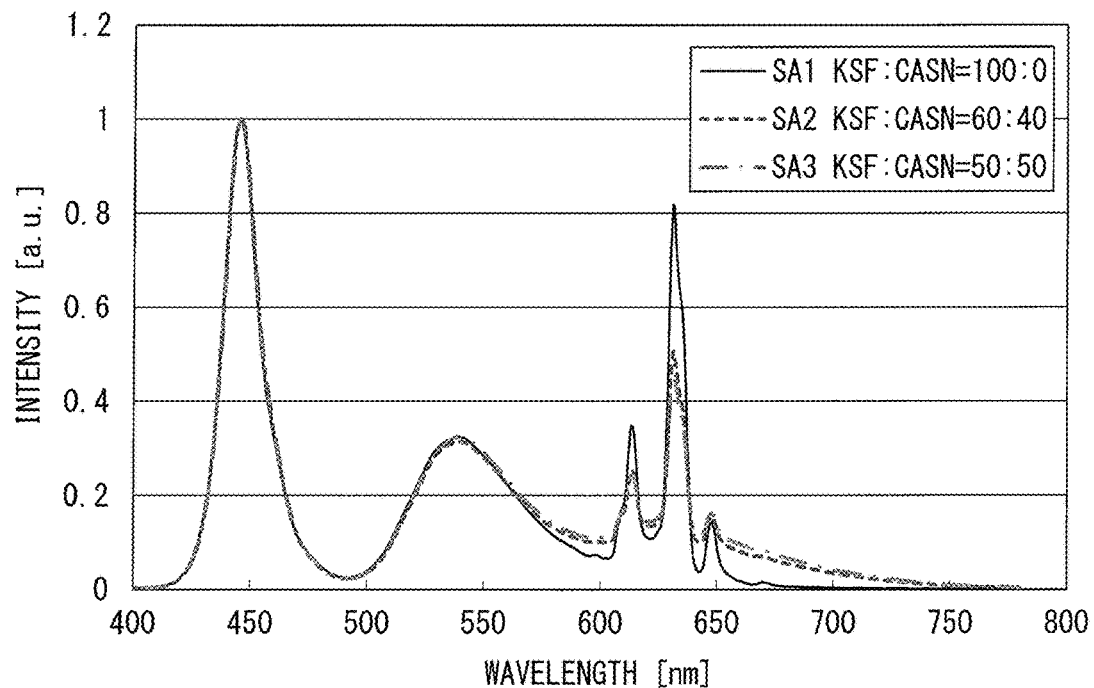
FIG. 7 is a diagram illustrating a light spectrum of an LED including a green phosphor in a case where an intensity ratio of peak wavelength between the KSF phosphor and the CASN phosphor is variously changed.
Figure 8:
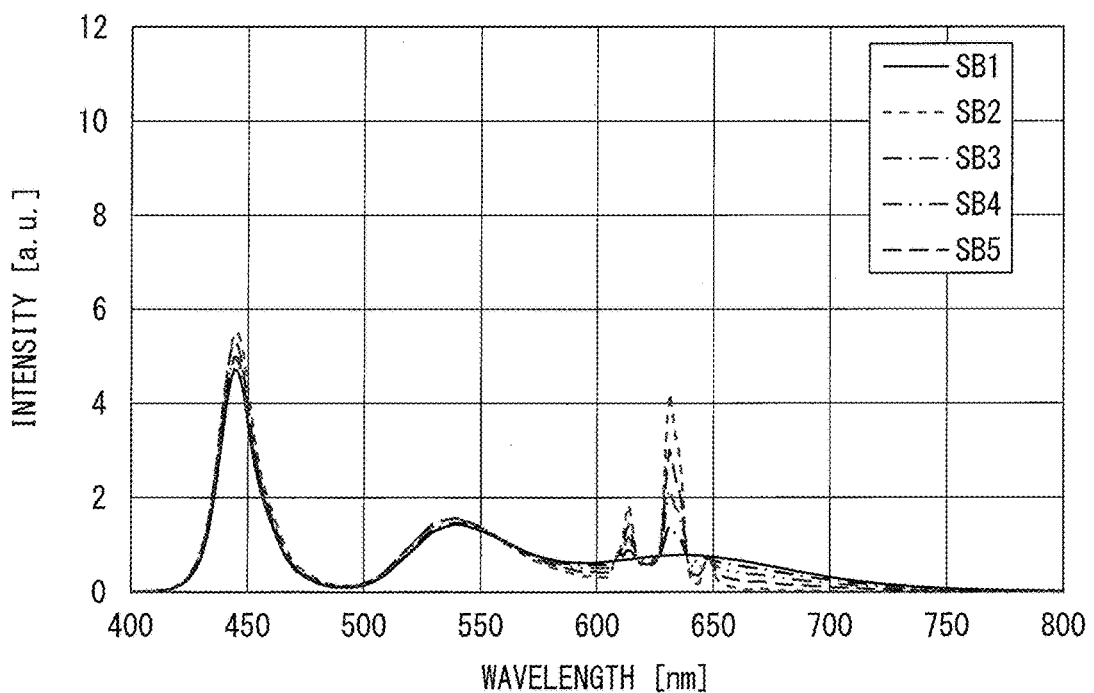
FIG. 8 is a diagram illustrating a light spectrum of the LED including the green phosphor in a case where the intensity ratio of peak wavelength between the KSF phosphor and the CASN phosphor is further changed.
Figure 9:
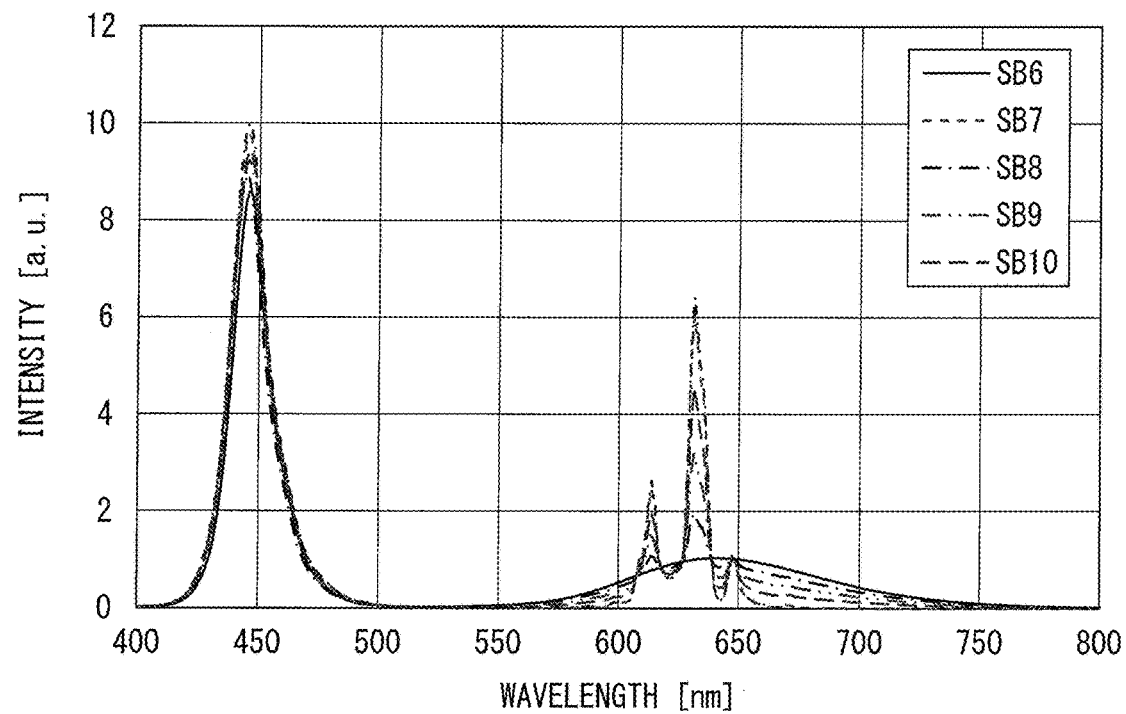
FIG. 9 is a diagram illustrating a light spectrum of the LED without including the green phosphor in a case where the intensity ratio of peak wavelength between the KSF phosphor and the CASN phosphor is variously changed.

FIG. 7 to FIG. 9 illustrate light spectrums in a case where an intensity ratio of peak wavelength between the KSF phosphor 15 and the CASN phosphor 16 is variously changed.

FIG. 7 is a diagram illustrating a light spectrum of the LED 11 including the green phosphor 17 in a case where an intensity ratio of peak wavelength between the KSF phosphor 15 and the CASN phosphor 16 is variously changed.

FIG. 8 is a diagram illustrating a light spectrum of the LED 11 including the green phosphor 17 in a case where the intensity ratio of peak wavelength between the KSF phosphor 15 and the CASN phosphor 16 is further changed.

FIG. 9 is a diagram illustrating a light spectrum of the LED 11 without including the green phosphor 17 in a case where the intensity ratio of peak wavelength between the KSF phosphor 15 and the CASN phosphor 16 is variously changed.

Since a light spectrum is changed depending on target chromaticity, the light spectrums illustrated in FIG. 7 and FIG. 9 are just examples.

In FIG. 7, the intensity ratio of peak wavelength between the KSF phosphor 15 and the CASN phosphor 16, which is denoted by respective spectrums SA1 to SA3, is as follows. In addition, in FIG. 7, blue light emitted from the LED chip 13 and green light emitted from the green phosphor 17 are also included.

Spectrum SA1 . . . KSF:CASN=100:0
Spectrum SA2 . . . KSF:CASN=60:40
Spectrum SA3 . . . KSF:CASN=50:50

In FIG. 8, the intensity ratio of peak wavelength between the KSF phosphor 15 and the CASN phosphor 16, which is denoted by respective spectrums SB1 to SB5, is as follows.

In addition, in FIG. 8 the blue light emitted from the LED chip 13 and the green light emitted from the green phosphor 17 are also included.

Spectrum SB1 . . . KSF:CASN=0:100
Spectrum SB2 . . . KSF:CASN=100:0
Spectrum SB3 . . . KSF:CASN=25:75
Spectrum SB4 . . . KSF:CASN=50:50
Spectrum SB5 . . . KSF:CASN=75:25

In FIG. 9, the intensity ratio of peak wavelength between the KSF phosphor 15 and the CASN phosphor 16, which is denoted by respective spectrums SB6 to SB10, is as follows. In addition, in FIG. 9 the blue light emitted from the LED chip 13 is included, but the green light emitted from the green phosphor 17 is not included.

Spectrum SB6 . . . KSF:CASN=0:100
Spectrum SB7 . . . KSF:CASN=100:0
Spectrum SB8 . . . KSF:CASN=25:75
Spectrum SB9 . . . KSF:CASN=50:50
Spectrum SB10 . . . KSF:CASN=75:25

As illustrated in FIG. 7 to FIG. 9, it can be seen that, in the red light in which lights emitted from each of the KSF phosphor 15 and the CASN phosphor 16 are mixed, as components of the light emitted from the KSF phosphor 15 increase, a light spectrum is obtained which has a narrow width of light spectrum that peaks near 630 nm and also has high intensity of the peak.

Figure 10:
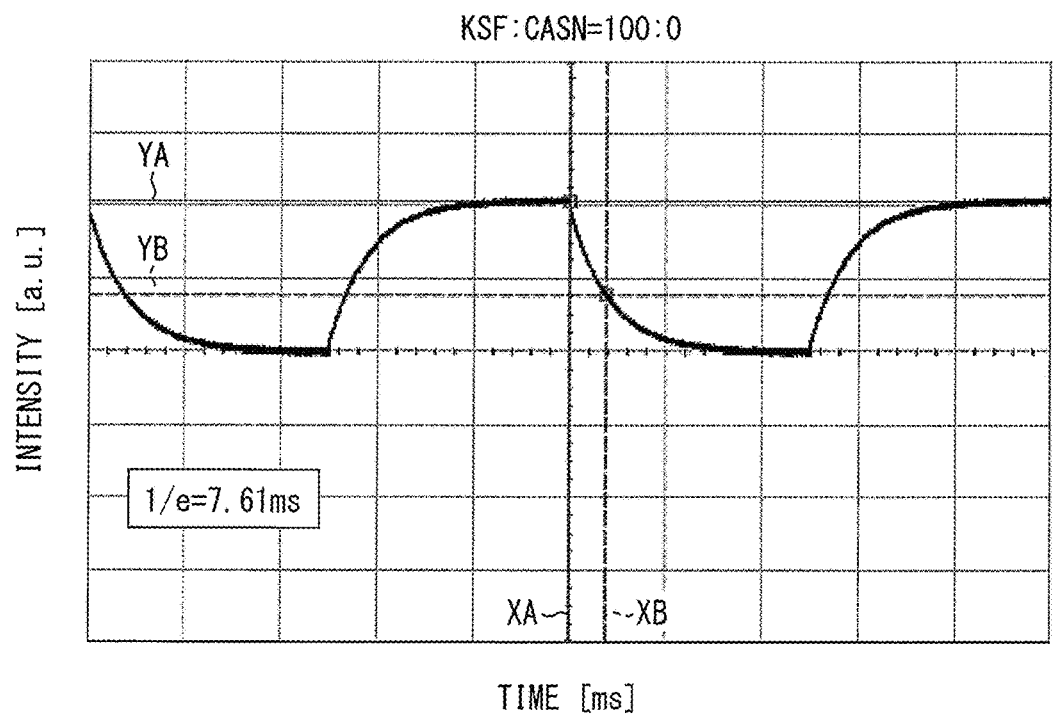
FIG. 10 is a diagram illustrating measurement results of afterglow time of a red phosphor in a case where the intensity ratio of peak wavelength between the KSF phosphor and the CASN phosphor is KSF:CASN=100:0.
Figure 11:
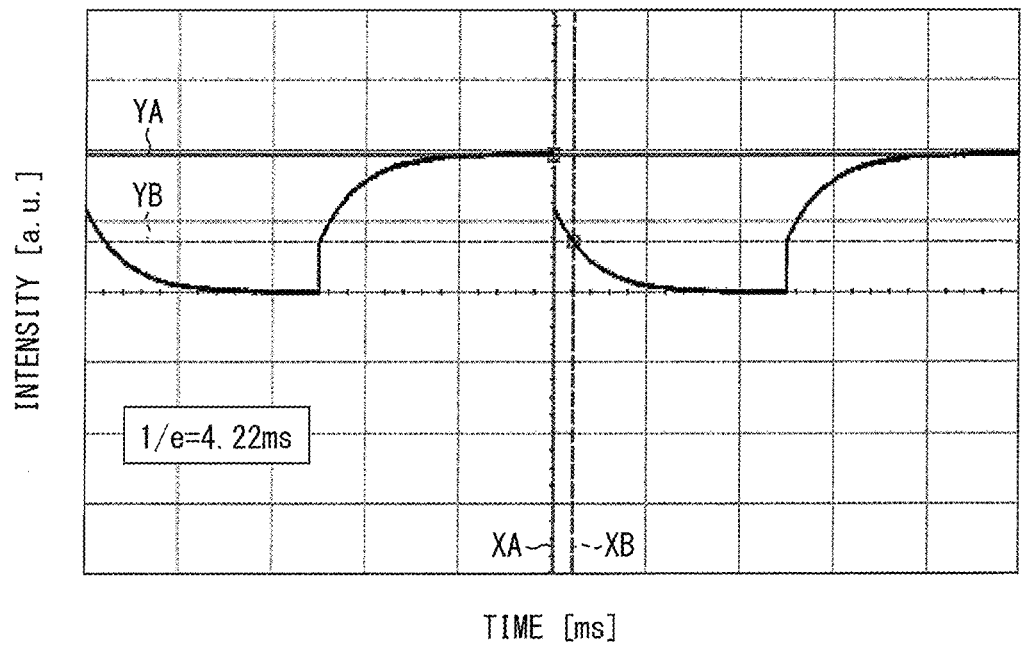
FIG. 11 is a diagram illustrating measurement results of afterglow time of the red phosphor in a case where the intensity ratio of peak wavelength between the KSF phosphor and the CASN phosphor is KSF:CASN=75:25.
Figure 12:
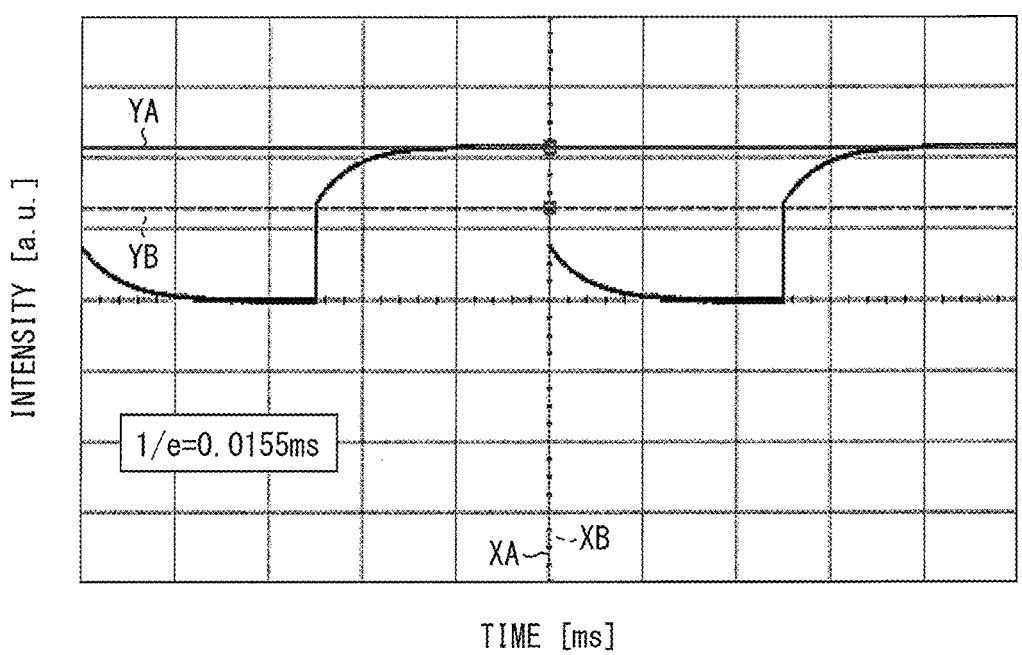
FIG. 12 is a diagram illustrating measurement results of afterglow time of the red phosphor in a case where the intensity ratio of peak wavelength between the KSF phosphor and the CASN phosphor is KSF:CASN=50:50.

FIG. 10 to FIG. 12 illustrate measurement results of the afterglow time of the red phosphor in a case where the intensity ratio of peak wavelength between the KSF phosphor 15 and the CASN phosphor 16 is changed.

FIG. 10 is a diagram illustrating measurement results of the afterglow time of the red phosphor in a case where the intensity ratio of peak wavelength between the KSF phosphor 15 and the CASN phosphor 16 is KSF:CASN=100:0.

FIG. 11 is a diagram illustrating measurement results of the afterglow time of the red phosphor in a case where the intensity ratio of peak wavelength between the KSF phosphor 15 and the CASN phosphor 16 is KSF:CASN=75:25.

FIG. 12 is a diagram illustrating measurement results of the afterglow time of the red phosphor in a case where the intensity ratio of peak wavelength between the KSF phosphor 15 and the CASN phosphor 16 is KSF:CASN=50:50.

In FIG. 10 to FIG. 12, time is denoted by the horizontal axis, and light intensity is denoted by the vertical axis. XA denotes start time of a falling edge of a red light emitted from a red phosphor, and YA denotes light intensity in the time XA. YA is light intensity of peak of the red phosphor. YB denotes light intensity when the light intensity from YA is 1/e, and XB denotes time of the intensity YB.

In FIG. 10, elapse time (elapse time from time XA to time XB) that is taken from light intensity YA which is the peak intensity of the red phosphor to intensity YB which is 1/e of the intensity is 7.61 ms.

In FIG. 11, the elapse time (elapse time from time XA to time XB) that is taken from the light intensity YA which is the peak intensity of the red phosphor to the intensity YB which is 1/e of the intensity is 4.22 ms.

In FIG. 12, the elapse time (elapse time from time XA to time XB) that is taken from the light intensity YA which is the peak intensity of the red phosphor to the intensity YB which is 1/e of the intensity is 0.0155 ms.

As illustrated in FIG. 10 to FIG. 12, it can be seen that, in the red light in which lights emitted from each of the KSF phosphor 15 and the CASN phosphor 16 are mixed, as components of the light emitted from the CASN phosphor 16 increase, the elapse time is shortened.

In the above description, the combination of the KSF phosphor 15 and the CASN phosphor 16 is mainly described as the combination of the first red phosphor and the second red phosphor. However, the combination of the first red phosphor and the second red phosphor is not limited to this. For example, the KSF phosphor 15 may be used as the first red phosphor, and a SCASN phosphor may be used as the second red phosphor. The SCASN phosphor is represented by the following chemical formula.

Chemical formula of SCASN phosphor . . . (Sr, Ca)AlSiN$_3$: Eu

Furthermore, the KSF phosphor 15 may be used as the first red phosphor, and an αCSiAlON phosphor may be used as the second red phosphor. The αCSiAlON phosphor is represented by the following chemical formula.

Chemical formula of αCSiAlON phosphor . . . Ca(Si,Al)$_{12}$(O,N)$_{16}$:EU

FIG. 4 illustrates a light emission state of the red light which is emitted from each of the KSF phosphor 15 and the CASN phosphor 16, in a case where the KSF phosphor 15 is used as the first red phosphor and the CASN phosphor 16 is used as the second red phosphor. However, the second red phosphor is not limited to the CASN phosphor 16, and a phosphor (second phosphor) which emits red light with an afterglow time that is equal to or shorter than 100 μs may be used instead of the CASN phosphor 16.

Figure 18:
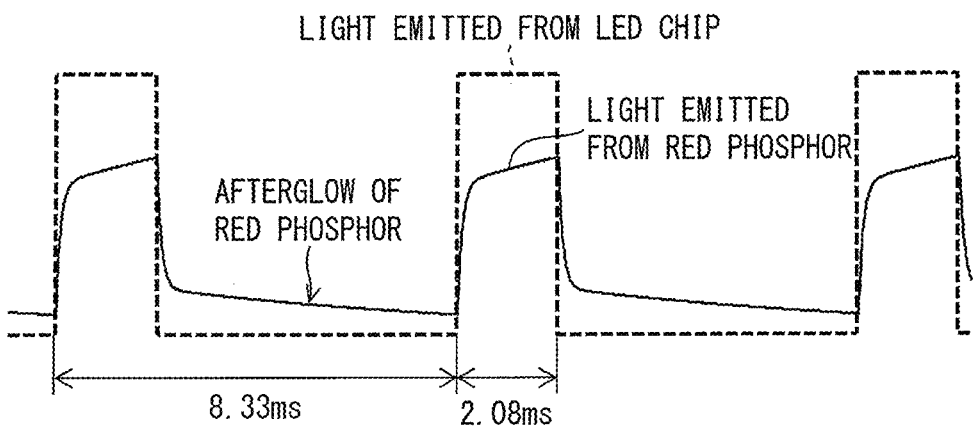
FIG. 18 is a diagram obtained by simulating light emission states of blue light and red light of the LED according to the PWM signal, using the KSF phosphor and a phosphor having an afterglow time which is assumed to be 100 μs.

FIG. 18 is a diagram obtained by simulating light emission states of the blue light and the red light of the LED according to the PWM signal, using the KSF phosphor and a phosphor having an afterglow time which is assumed to be 100 μs.

In FIG. 18, light emission of the LED chip represents a light emission state of the blue light which is emitted from the LED chip 13, and light emission of the red phosphor represents a light emission state of the red light that is emitted from the KSF phosphor 15 in which excitation emission is performed by the blue light emitted from the LED chip 13 and a phosphor which emits the blue light having an afterglow time of 100 μs. A frequency and duty of the PWM signal which is supplied from the constant current circuit 23 to the LED circuit 25 are respectively 120 Hz and 25%, and a light intensity ratio between the KSF phosphor 15 and the phosphor which emits the red light having an afterglow time of 100 μs is 50:50.

In the same manner as in FIG. 4, in FIG. 18, a rising edge and a falling edge of the light emitted from the phosphor containing two types of phosphors which are the KSF phosphor 15 and the phosphor emitting the red light having an afterglow time of 100 μs are steeper than a rising edge and a falling edge of the light emitted from the red phosphor composed of only the KSF phosphor illustrated in FIG. 17.

That is, it can be seen that after the light emission of the LED chip is off, the afterglow of the red phosphor containing two types of phosphors which are the KSF phosphor 15 and the phosphor emitting the red light having an afterglow time of 100 μs that are illustrated in FIG. 18 is reduced more than that of the red phosphor composed of only the KSF phosphor illustrated in FIG. 17.

Since the afterglow time of KSF phosphor (first phosphor) is approximately 10 ms, the afterglow time of the phosphor (second phosphor) which emits the red light having an afterglow time of 100 μs is 1/100 of the afterglow time of the KSF phosphor (first phosphor). That is, a response speed of the second phosphor may be equal to or faster than 100 times the response speed of the first phosphor.

In this way, the second red phosphor (second phosphor) distributed in the resin 14 may be a phosphor which emits red light having an afterglow time equal to or less than 100 μs, and a phosphor which emits the red light using allowed transition satisfies the requirement of the response time. It is more preferable to use, as the second red phosphor, particularly a phosphor material in which the afterglow time which is the time taken for the light intensity to become 1/e is equal to or less than 10 μs.

(Main Effects)

As described above, the LED 11 includes the LED chip 13 which emits the blue light as primary light, the resin 14 which seals the LED chip 13, and the KSF phosphor 15 and the CASN phosphor 16 which are distributed in the resin 14, absorb a part of the blue light that is primary light, and emit the red light as secondary light having a wavelength longer than that of the blue light. In addition, the KSF phosphor 15 absorbs the blue light which is primary light and emits the red light which is secondary light by the forbidden transition. Meanwhile, the CASN phosphor 16 absorbs the blue light which is primary light and emits the red light which is secondary light by the allowed transition.

For this reason, it is possible to obtain the red light having a narrow wavelength width near a peak wavelength of 630 nm according to the light emitted from the KSF phosphor 15, as secondary light. For this reason, it is possible to obtain secondary light with high color purity. Meanwhile, it is possible to obtain the fast red light having the afterglow time which is the time t required for the light intensity to become 1/e from light intensity at the time of extinguishing primary time and which is approximately equal to or longer than 1 μs and equal to or shorter than 10 μs, as secondary light by the CASN phosphor 16. For this reason, it is possible to obtain second light having a fast response speed. That is, it is possible to obtain the LED 11 having high color purity of the red light as secondary light and a fast response speed.

In addition, the LED 11 includes the package 12 in which only one cavity 12a that is a concave portion is provided. The LED chip 13 is disposed in the cavity 12a, and the resin 14 is disposed in the cavity 12a.

In addition, two types of phosphors which are the KSF phosphor 15 that emits the red light by the forbidden transition and the CASN phosphor 16 that emits the red light by the allowed transition, emit light having the same color, and are different from each other, are distributed in the resin 14.

Accordingly, it is possible to obtain the LED 11 which has one cavity, emits red light having high color purity as secondary light, and has a fast response speed.

A wavelength width (wavelength band) of the peak wavelength of the red light which is secondary light that is emitted from the KSF phosphor 15 distributed in the resin 14 is equal to or less than 30 nm. For this reason, it is possible to obtain red light with high color purity. Furthermore, the afterglow time of the CASN phosphor 16 which is the time required for the intensity of the secondary light to become 1/e when the LED chip 13 extinguishes the primary light which is on, is approximately equal to or longer than 1 μs and equal to or shorter than 10 μs and is equal to or shorter than 100 μs, and a response speed of the CASN phosphor 16 is fast. For this reason, it is possible to obtain the LED 11 which emits red light with high color purity as secondary light and has a high response speed.

(Additional Matters)

In the first embodiment, it is described that the KSF phosphor 15 and the CASN phosphor 16 which are red phosphor, and the green phosphor 17 are distributed in the resin 14 which seals the LED chip 13. Mn-activated γ-AlON, and β-type SiAlON which is a divalent Eu-activated oxynitride phosphor or a divalent Eu-activated silicate phosphor may be distributed as the green phosphor 17.

Accordingly, as described in PTL 3, the Mn-activated γ-AlON of the green phosphor obtains a narrow spectrum by the phosphor of the forbidden transition type, but has a delayed response speed, in the same manner as in the KSF phosphor which is a red phosphor. The divalent Eu-activated oxynitride phosphor or a divalent Eu-activated silicate phosphor of the green phosphor has a fast response speed in the same manner as CASN phosphor which is a red phosphor.

Embodiment 2

A second embodiment of the present invention will be described as follows with reference to FIG. 13 to FIG. 16. In addition, for the sake of convenience of description, the same symbols will be attached to the members having the same functions as the members described in the embodiment 1, and description thereof will be omitted.

FIG. 13(a) is an expanded plan view illustrating a part of a light source unit 37 in an illumination device 31 according to embodiment 2, and FIG. 13(b) is a sectional view of the illumination device 31.

Figure 13:
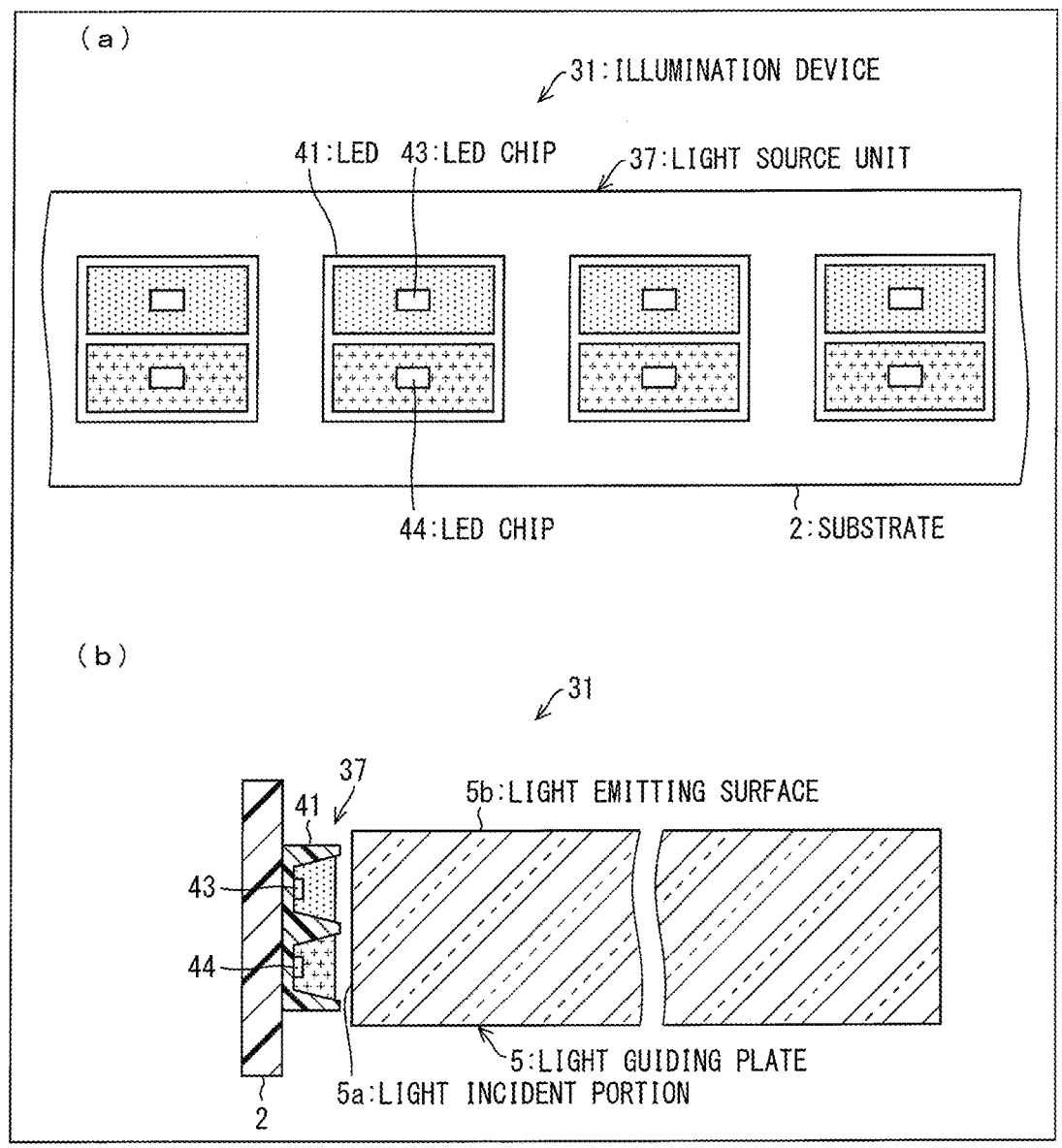
FIG. 13(a) is an expanded plan view illustrating a part of a light source unit in an illumination device according to Embodiment 2.
FIG. 13(b) is a sectional view of the illumination device.

As illustrated in FIGS. 13(a) and 13(b), the illumination device 31 includes the substrate 2, multiple LEDs (light emitting device) 41, and the light guiding plate 5. In addition, the illumination device 31 also includes an LED drive control unit (refer to FIG. 15), which is not illustrated in FIG. 13, for controlling drive of the multiple LEDs 41.

The multiple LEDs 41 are mounted on the substrate 2 so as be lined up in one line in a longitudinal direction of the substrate 2. In addition, the LED 41 includes two LEDs of an LED chip (first light emitting element) 43 and an LED chip (second light emitting element) 44 which are disposed with an interval therebetween.

The LEDs 41 are disposed such that the LED chips 43 on one side of the respective LEDs 41 are lined up in one line in the longitudinal direction of the substrate 2, and the LED chips 44 on the other side of the respective LEDs 41 are lined up in one line in the longitudinal direction of the substrate 2. In addition, the LEDs 41 are disposed with an interval such that the two LED chips 43 and 44 are lined up in a direction (short-hand direction of the substrate 2) orthogonal to a column direction (longitudinal direction of the substrate 2) between adjacent columns.

The multiple LED chips 43 which are lined up in the same column direction (longitudinal direction of the substrate 2) are coupled in series, and each configures an LED circuit 55 which will be below. In addition, the multiple LED chips 44 which are lined up in the same column direction (longitudinal direction of the substrate 2) are coupled in series, and each configures an LED circuit 56 which will be below.

The substrate 2 and the LED 41 configure the light source unit 37. In the light source unit 37, a light emitting surface of each of the multiple LEDs 41 faces the light incident portion 5a and is disposed at a location close to the light guiding plate 5, such that light emitted from the LED chips 43 and 44 of each of the multiple LEDs 41 is incident on the light incident portion 5a of the light guiding plate 5.

(Configuration of LED 41)

Figure 14:
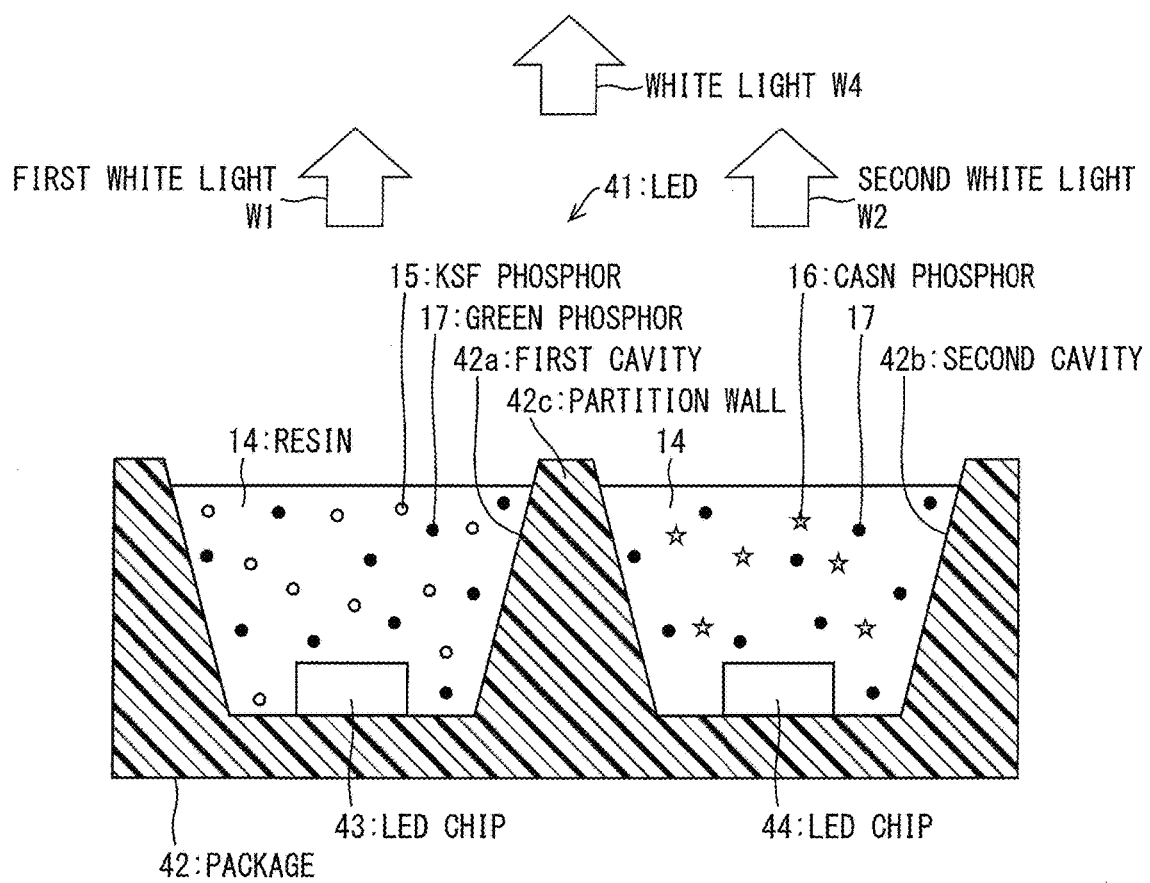
FIG. 14 is a sectional view of an LED in the illumination device according to Embodiment 2.

FIG. 14 is a sectional view of the LED 41 in the illumination device 31. The LED 41 includes a package 42, the LED chips 43 and 44, the resin 14, the KSF phosphor 15, the CASN phosphor 16, and the green phosphor 17.

The package 42 includes two concave portions of a first cavity (concave portion) 42a and a second cavity (concave portion) 42b. The first cavity 42a is a space which is provided in the package 42, such that the LED chip 43 is mounted on a bottom surface in the concave portion and a side surface of the concave portion is used as a reflecting surface. The second cavity 42b is a space which is provided in the package 42, such that the LED chip 44 is mounted on a bottom surface in the concave portion and a side surface of the concave portion is used as a reflecting surface.

In the same manner as the package 12 according to the aforementioned Embodiment 1, the package 42 is formed of a nylon-based material, and is provided by insert molding such that a lead frame which is not illustrated is exposed on the bottom surface in each of the first cavity 42a and the second cavity 42b of the package 42. The lead frame is divided into two parts at an exposed portion in each of the first cavity 42a and the second cavity 42b.

The package 42 includes a reflecting surface which forms an inner side surface of each of the first cavity 42a and the second cavity 42b. It is preferable that the each reflecting surface is formed of a metal film with high reflectance including Ag or Al, or white silicone, such that light which is emitted from the LED chips 43 and 44 is reflected to the outside of the LED 41.

Furthermore, the package 42 includes a partition wall 42c between the first cavity 42a and the second cavity 42b which are positioned at two places. Light which is emitted from the two LED chips 43 and 44 is blocked by the partition wall 42c between two LED chips 43 and 44 in the LED 41. That is, the two LED chips 43 and 44 are chemically separated from each other by the partition wall 42c.

The LED chip 43 is mounted on a bottom portion of the first cavity 42a which is a concave portion on a side of the package 42, the first cavity 42a is filled with the resin 14, and thereby the LED chip 43 is sealed. The KSF phosphor 15 and the green phosphor 17 are distributed in the resin 14 by which the LED chip 43 is sealed.

The LED chip 44 is mounted on a bottom portion of the second cavity 42b which is a concave portion on the other side of the package 42, the second cavity 42b is filled with the resin 14, and thereby the LED chip 44 is sealed. The CASN phosphor 16 and the green phosphor 17 are distributed in the resin 14 by which the LED chip 44 is sealed.

In a case where a light intensity ratio between the KSF phosphor 15 and the CASN phosphor 16 is 50:50, a mixture ratio (weight %) of the KSF phosphor 15 and the green phosphor 17 is 100:75.7. Meanwhile, a mixture ratio (weight %) of the CASN phosphor 16 and the green phosphor 17 is 13.7:75.7. The mixture ratio of the green phosphor 17 is changed by chromaticity of the LED chips 43 and 44.

The LED chip 43 and 44 is, for example, a gallium nitride (GaN) based semiconductor light emitting element having a conductive substrate. A bottom electrode is formed on a bottom surface of the conductive substrate and an upper electrode is formed on a surface opposite to the bottom surface, which are not illustrated. In the same manner as in the LED chip 13, light (primary light) which is emitted from the LED chips 43 and 44 is blue light in a range from 430 nm to 480 nm, and a blue LED chip having a peak wavelength near 450 nm.

In the LED 41 having the aforementioned configuration, the primary light (blue light) which is emitted from the LED chip 43 on one side passes through the resin 14. A part thereof excites the KSF phosphor 15 thereby being converted into secondary light (red light), and excites the green phosphor 17 thereby being converted into secondary light (green light). In this way, first white light W1, which is obtained by mixing the primary blue light and the secondary red and green light from the KSF phosphor 15, is emitted from the first cavity 42a to the outside of the LED 41.

In the LED 41, the primary light (blue light) which is emitted from the second cavity 42b passes through the resin 14. A part thereof excites the CASN phosphor 16 thereby being converted into the secondary light (red light), and excites the green phosphor 17 thereby being converted into the secondary light (green light). In this way, second white light W2, which is obtained by mixing the primary blue light and the secondary red and green light from the CASN phosphor 16, is emitted from the second cavity 42b of the LED 41 to the outside of the LED 41.

Hence, in the LED 41, white light W4 which is obtained by mixing the first white light W1 which is emitted from the first cavity 42a and the second white light W2 which is emitted from the second cavity 42b is emitted to the outside of the LED 41.

In this way, the LED 41 includes the package 42 in which the first cavity 42a and the second cavity 42b that are multiple concave portions are provided, the LED chip 43 is disposed on the bottom surface in the first cavity 42a, and the LED chip 44 is disposed on the bottom surface in the second cavity 42b.

The resin 14 is disposed in each of the first cavity 42a and the second cavity 42b, the KSF phosphor 15 is distributed in the resin 14 which is disposed in the first cavity 42a, and the CASN phosphor 16 is distributed in the resin 14 which is disposed in the second cavity 42b. Accordingly, it is possible to obtain the LED 41 which includes the multiple cavities of the first cavity 42a and the second cavity 42b, and has high color purity of the red light as secondary light and a fast response speed.

It is described that the LED 41 has two cavities of the first cavity 42a and the second cavity 42b which are integrally provided in the package 42, but the number of cavities which are provided in the package 42 is not limited to two pieces and may be three or more.

In addition, it is described that the LED 41 includes a light emitting unit which emits the first white light W1 and the second white light W2 in one package, but a configuration may be provided in which the package is divided into two packages of one LED that emits the first white light and the other LED that emits the second white light. That is, the LED 41 may have a configuration in which a light intensity ratio between the first white light W1 and the second white light W2 can be changed, and may have a configuration in which the package is configured by two or more LEDs different from each other.

(Configuration of LED Drive Control Unit 51)

Figures 15, 16:
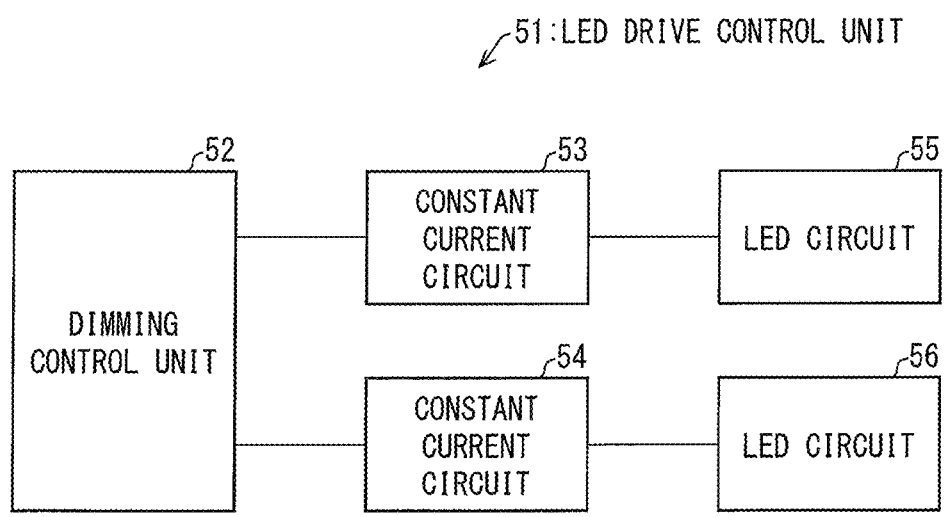
FIG. 15 is a block diagram illustrating a configuration of an LED drive control unit which controls driving of a first LED chip and a second LED chip in the LED according to Embodiment 2.
FIG. 16 is a diagram illustrating a relationship between a PWM signal and drive states of the first LED chip and the second LED chip.

FIG. 15 is a block diagram illustrating a configuration of an LED drive control unit 51 which controls drive of the LED chips 43 and 44.

As illustrated in FIG. 15, the LED drive control unit 51 includes a dimming control unit (pulse width modulation signal generation unit) 52, constant current circuits 53 and 54, and LED circuits 55 and 56. The LED circuit 55 is a series circuit of the LED chip 43 which is mounted on the substrate 2. The LED circuit 56 is a series circuit of the LED chip 44 which is mounted on the substrate 2.

The dimming control unit 52 independently controls illumination time of the LED chips 43 and 44 of the LED circuits 55 and 56 according to PWM control. For this reason, the dimming control unit 52 includes a PWM circuit (not illustrated) which independently generates a first PWM signal that is provided to the LED circuit 55 and a second PWM signal that is provided to the LED circuit 56. The PWM circuit changes a duty ratio of the PWM signals according to instruction from the outside and generates the first PWM signal and the second PWM signal.

The constant current circuit 53 generates a constant current which flows through the LED circuit 55, based on the first PWM signal which is supplied from the dimming control unit 52. While the constant current circuit 53 is on during a period in which the first PWM signal has an H level thereby supplying a constant current to the LED circuit 55, the constant current circuit 53 is off during a period in which the first PWM signal has an L level thereby stopping supply of a constant current to the LED circuit 55.

The constant current circuit 54 generates a constant current which flows through the LED circuit 56, based on the second PWM signal which is supplied from the dimming control unit 52. While the constant current circuit 54 is on during a period in which the second PWM signal has an H level thereby supplying a constant current to the LED circuit 56, the constant current circuit 54 is off during a period in which the second PWM signal has an L level thereby stopping supply of a constant current to the LED circuit 56.

As described above, in the LED drive control unit 51, the dimming control unit 52 generates the first PWM signal for making the LED chip 43 emit light by a pulse width modulation, and the second PWM signal for making the LED chip 44 emit light by a pulse width modulation. In addition, the dimming control unit 52 outputs the generated first PWM signal to the constant current circuit 53. The constant current circuit 53 drives the LED chip 43 by making a current flow through the LED circuit 55, based on the first PWM signal which is input from the dimming control unit 52. In addition, the dimming control unit 52 outputs the generated second PWM signal to the constant current circuit 54. The constant current circuit 54 drives the LED chip 44 by making a current flow through the LED circuit 56, based on the second PWM signal which is input from the dimming control unit 52.

In this way, the constant current circuit 53 controls the current which flows through the LED circuit 55 according to the first PWM signal which is independently controlled by the dimming control unit 52. In addition, the constant current circuit 54 controls the current which flows through the LED circuit 56 according to the second PWM signal. Accordingly, light intensity of the LED chips 43 and 44 are independently controlled.

For this reason, it is possible to independently adjust intensity of the first white light W1 which is obtained by mixing the primary light from the LED chip 43 and the secondary light which is emitted from the KSF phosphor 15 that absorbs the primary light, and intensity of the second white light W2 which is obtained by mixing the primary light from the LED chip 44 and the secondary light which is emitted from the CASN phosphor 16 that absorbs the primary light. Accordingly, it is possible to obtain the light source unit 37 with wide color reproducibility and a high response speed.

(Illumination Control of LED Chips 43 and 44)

FIG. 16 is a diagram illustrating a relationship between the PWM signal and drive states of the LED chips 43 and 44. In FIG. 16, states (1) to (4) represent the following states.

State (1): a case where it is required that the LED chip 43 is illuminated and the LED chip 44 is not illuminated.

State (2): a case where it is required that the LED chip 43 is not illuminated and the LED chip 44 is illuminated.

State (3): a case where it is required that both the LED chips 43 and 44 are illuminated together.

State (4): a case where it is required that both the LED chips 43 and 44 are not illuminated together.

As described in FIG. 16, when state (1) is required, the PWM circuit included in the dimming control unit 52 generates the PWM signal which makes the LED chip 43 go into an H level, and the PWM signal which makes the LED chip 44 go into an L level. The PWM circuit respectively outputs the respectively generated PWM signals to the constant current circuits 53 and 54. The constant current circuit 53 makes a constant current flow through the LED circuit 55, based on the PWM signal having an H level which is output from the PWM circuit, and lights the LED chip 43. Meanwhile, the constant current circuit 54 does not make a constant current flow through the LED circuit 55, based on the PWM signal having an L level which is output from the PWM circuit, and does not light the LED chip 44. Accordingly, the white light W4 which is configured by only the first white W1 including the red light that is emitted from the KSF phosphor 15 is emitted from the first cavity 42a to the outside of the LED 41.

At the time of state (2), the PWM circuit generates the PWM signal which makes the LED chip 43 go into an L level, and the PWM signal which makes the LED chip 44 go into an H level. The PWM circuit respectively outputs the respectively generated PWM signals to the constant current circuits 53 and 54. The constant current circuit 53 does not make a constant current flow through the LED circuit 55, based on the PWM signal having an H level which is output from the PWM circuit, and does not light the LED chip 43. Meanwhile, the constant current circuit 54 makes a constant current flow through the LED circuit 55, based on the PWM signal having an H level which is output from the PWM circuit, and lights the LED chip 44. Accordingly, the white light W4 which is configured by only the second white W2 including the red light that is emitted from the CASN phosphor 16 is emitted from the second cavity 42b to the outside of the LED 41.

At the time of state (3), the PWM circuit generates the PWM signal which makes the LED chip 43 go into an H level, and the PWM signal which makes the LED chip 44 go into an H level. The PWM circuit respectively outputs the respectively generated PWM signals to the constant current circuits 53 and 54. The constant current circuit 53 makes a constant current flow through the LED circuit 55, based on the PWM signal having an H level which is output from the PWM circuit, and lights the LED chip 43. Meanwhile, the constant current circuit 54 makes a constant current flow through the LED circuit 56, based on the PWM signal having an H level which is output from the PWM circuit, and lights the LED chip 44. Accordingly, the white light W4 which is configured by the first white W1 including the red light that is emitted from the KSF phosphor 15 and the second white W2 including the red light that is emitted from the CASN phosphor 16 is emitted from the first cavity 42a and the second cavity 42b to the outside of the LED 41.

At the time of state (4), the PWM circuit generates the PWM signal which makes the LED chip 43 go into an L level, and the PWM signal which makes the LED chip 44 go into an L level. The PWM circuit respectively outputs the respectively generated PWM signals to the constant current circuits 53 and 54. The constant current circuit 53 does not make a constant current flow through the LED circuit 55, based on the PWM signal having an L level which is output from the PWM circuit, and does not light the LED chip 43. Meanwhile, the constant current circuit 54 does not make a constant current flow through the LED circuit 56, based on the PWM signal having an L level which is output from the PWM circuit, and does not light the LED chip 44. Accordingly, the LED 41 is not illuminated.

The dimming control unit 52 changes current setting values of the constant current circuit 53 and the constant current circuit 54 thereby being able to control intensity of light which is emitted from the LED circuit 55 and the LED circuit 56, and a ratio of light quantity between the first white W1 and the second white W2 can also be arbitrarily controlled.

As the dimming control unit 52 controls drive current values of the LED circuits 55 and 56 and a duty ratio of the PWM signal, it is possible to easily change a ratio of amount of light between the first white W1 and the second white W2.

Here, in the present embodiment, the illumination device 31 (refer to FIG. 13) and a display panel which is illuminated by the illumination device 31 are provided, and thus, for example, the following mode (first mode) A and mode (second mode) B are used as a display mode which is required for a display device such as a liquid crystal television that is used for the illumination device 31.

Mode A: a case where clear image quality is required rather than a response speed.

Mode B: a case where a response speed is required rather than clear image quality.

In mode A, the dimming control unit 52 in the illumination device 31 increases the amount of the first white W1 and decreases the amount of the second white W2. Alternatively, the illumination device 31 decreases the amount of the second white W2 to zero. That is, the dimming control unit 52 does not light the LED chip 44, but decreases the amount of light of the LED chip 44 more than that of the LED chip 43, and increases the amount of light of the LED chip 43 more than that of the LED chip 44. Accordingly, the LED chip 43 emits the amount of light more than that of the LED chip 44. As a result, the display device can display clearer images.

In mode B, the dimming control unit 52 in the illumination device 31 decreases the amount of the first white W1 and increases the amount of the second white W2 more than that of the first white W1. Alternatively, the illumination device 31 decreases the amount of the first white W1 to zero. That is, the dimming control unit 52 does not light the LED chip 43, but decreases the amount of light of the LED chip 43 more than that of the LED chip 44, and increases the amount of light of the LED chip 44 more than that of the LED chip 43. By doing so, the LED chip 44 emits the amount of light more than that of LED chip 43. As a result, the display device can display images at a faster response speed.

As described above, the mode A and the mode B which are required for a display device of a liquid crystal television or the like for which the illumination device 31 is used can also be realized by the illumination device 31.

In the second embodiment, it is described that the KSF phosphor 15 used as a red phosphor and the green phosphor 17 are distributed in the resin 14 which seals the LED chip 43, and the CASN phosphor 16 used as a red phosphor and the green phosphor 17 are distributed in the resin 14 which seals the LED chip 44. However, the KSF phosphor 15 used as a red phosphor and Mn-activated γ-AlON used as a green phosphor may be distributed in the resin 14 which seals the LED chip 43, and the CASN phosphor 16 used as a red phosphor and β-type SiAlON which is a divalent Eu-activated oxynitride phosphor used as a green phosphor or a divalent Eu-activated silicate phosphor may be distributed in the resin 14 which seals the LED chip 44.

Embodiment 3

A third embodiment of the present invention will be described as follows. In addition, for the sake of convenience of description, the same symbols will be attached to the members having the same functions as the members described in the embodiments 1 and 2, and description thereof will be omitted.

In a case of a drive state in which duty of the signal which is used in the LED 11 (refer to FIG. 1) described in embodiment 1 or the LED 41 (refer to FIG. 14) described in embodiment 2 is equal to or less than 50%, the mixture ratio of the KSF phosphor 15 and the CASN phosphor 16 is adjusted according to the frequency of the PWM signal. Accordingly, it is possible to improve video quality of a display device such as a liquid crystal television which uses the LED 11 or the LED 41.

(a) When the frequency (frame frequency) of the PWM signal is equal to or higher than 60 Hz and lower than 120 Hz In the display device, the frequencies (frame frequencies) of the PWM signals of the illumination devices 1 and 31 are set to be equal to or higher than 60 Hz and lower than 120 Hz. In this case, a light intensity ratio (peak ratio of light spectrum) between the KSF phosphor 15 and the CASN phosphor 16 in the LED 11 or the LED 41 needs to be KSF:CASN=20:80.

In a case where the illumination device 1 in which the LED 11 having one cavity per package that is described in embodiment 1 is manufactured, the KSF phosphor 15 and the CASN phosphor 16 are distributed in the resin 14 in a manufacturing process of the LED 11 such that a mixture ratio (weight %) of the KSF phosphor 15 and the CASN phosphor 16 is KSF:CASN=40:21.9. By doing so, the light intensity ratio (peak ratio of light spectrum) between the KSF phosphor 15 and the CASN phosphor 16 in the LED 11 can be KSF:CASN=20:80.

Meanwhile, in embodiment 2, a light intensity ratio between white lights (first white W and second white W) from two light sources is changed by changing a duty ratio of PWM or an LED drive current value. Accordingly, in embodiment 2, it is possible to appropriately switch the light intensity ratio according to an operation mode of a television, and furthermore, to obtain merit such as finely setting a light amount ratio.

In embodiment 2, it is described that, in manufacturing conditions of the LED 41, the mixture ratio of the phosphors respectively distributed in the first cavity 42a and the second cavity 42b is set to a ratio in which a light intensity ratio at the time of driving the two light sources (LED chips 43 and 44) in the same conditions is 50:50. In addition, by changing a duty ratio or a drive current, the light intensity ratio between the first cavity 42a and the second cavity 42b can be changed.

In a case where the illumination device 1 in which the LED 41 having two cavities per package that is described in embodiment 2 is manufactured, the illumination device 1 is realized by controlling the PWM signal in which an intensity ratio of peak wavelength between the first white light W1 and the second white light W2 is 20:80, or the LED drive current.

In a manufacturing process of the LED 41, the KSF phosphor 15 and the green phosphor 17 are distributed in the resin 14 such that a mixture ratio (weight %) of the KSF phosphor 15 and the green phosphor 17 is KSF:green phosphor=100:75.7. By doing so, the KSF phosphor 15 and the green phosphor 17 are distributed in the resin 14 which seals the first cavity 42a such that KSF:green phosphor=100:75.7.

Furthermore, in a manufacturing process of the LED 41, the CASN phosphor 16 and the green phosphor 17 are distributed in the resin 14 such that a mixture ratio (weight %) of the CASN phosphor 16 and the green phosphor 17 is CASN:green phosphor=13.7:75.7. By doing so, the CASN phosphor 16 and the green phosphor 17 are distributed in the resin 14 which seals the second cavity 42b such that CASN:green phosphor=13.7:75.7.

The other manufacturing processes of the LED 41 are the same as the manufacturing processes of the LED having two cavities per normal package. The LED 41 which is obtained by doing so is mounted in the illumination device 31.

Furthermore, the dimming control unit 52 (refer to FIG. 15) generates the first PWM signal and the second PWM signal such that an intensity ratio between a peak wavelength of the red wavelength components of the first white light W1 and a peak wavelength of the red wavelength components of the second white light W2 is 20:80, outputs the first PWM signal to the constant current circuit 53, and outputs the second PWM signal to the constant current circuit 54. The constant current circuit 53 outputs a constant current based on the first PWM signal which is input from the dimming control unit 52 to the LED circuit 55, and the constant current circuit 54 outputs a constant current based on the second PWM signal which is input from the dimming control unit 52 to the LED circuit 56.

In a case where the illumination device 1 is manufactured at the mixture ratio (weight %) of the phosphor described above, if the LED chip 43 and the LED chip 44 are illuminated in the same drive conditions as each other, the first white light W1 and the second white light W2 are emitted at a light intensity ratio of peak wavelength of 50:50. Here, in the dimming control unit 52, if a ratio between the duty ratios of the first PWM signal and the second PWM signal is 20:80, the intensity ratio of peak wavelength between the first white light W1 and the second white light W2 is 20:80. An LED drive current value may be set, such that a current having a current value in which light brightness of the LED chip 43 and the LED chip 44 is 20:80 is output from the constant current circuit 53 and the constant current circuit 54, in accordance with a forward current of the LED chip vs characteristics of light brightness.

It is needless to say that, even in a case where the mixture ratios of the phosphors are different from each other, if the duty ratio of the PWM signal or an LED drive current value is appropriately set, light intensity in which the intensity ratio of peak waveform between the first white light W1 and the second white light W2 is 20:80 can be realized in the same manner.

As described above, the light intensity ratio (peak ratio of light spectrum) between the KSF phosphor 15 and the CASN phosphor 16 in the LED 41 can be KSF:CASN=20:80.

(b) When the frequency (frame frequency) of the PWM signal is equal to or higher than 120 Hz and equal to or lower than 240 Hz In the display device, the frequencies (frame frequencies) of the PWM signals of the illumination devices 1 and 31 are set to be equal to or higher than 120 Hz and equal to or lower than 240 Hz. In this case, a light intensity ratio (peak ratio of light spectrum) between the KSF phosphor 15 and the CASN phosphor 16 in the LED 11 or the LED 41 needs to be KSF:CASN=50:50.

In a case where the illumination device 1 in which the LED 11 having one cavity per package that is described in embodiment 1 is manufactured, the KSF phosphor 15 and the CASN phosphor 16 are distributed in the resin 14 in a manufacturing process of the LED 11 such that a mixture ratio (weight %) of the KSF phosphor 15 and the CASN phosphor 16 is KSF:CASN=100:13.7. By doing so, the light intensity ratio (peak ratio of light spectrum) between the KSF phosphor 15 and the CASN phosphor 16 in the LED 11 can be KSF:CASN=50:50.

In a case where the illumination device 1 in which the LED 41 having two cavities per package that is described in embodiment 2 is manufactured, the illumination device 1 is realized by controlling the PWM signal in which an intensity ratio of peak wavelength between the first white light W1 and the second white light W2 is 50:50, or the LED drive current.

In a manufacturing process of the LED 41, the KSF phosphor 15 and the green phosphor 17 are distributed in the resin 14 such that a mixture ratio (weight %) of the KSF phosphor 15 and the green phosphor 17 is KSF:green phosphor=100:75.7. By doing so, the KSF phosphor 15 and the green phosphor 17 are distributed in the resin 14 which seals the first cavity 42a such that KSF:green phosphor=100:75.7.

Furthermore, in a manufacturing process of the LED 41, the CASN phosphor 16 and the green phosphor 17 are distributed in the resin 14 such that a mixture ratio (weight %) of the CASN phosphor 16 and the green phosphor 17 is CASN:green phosphor=13.7:75.7. By doing so, the CASN phosphor 16 and the green phosphor 17 are distributed in the resin 14 which seals the second cavity 42b such that CASN:green phosphor=13.7:75.7.

The other manufacturing processes of the LED 41 are the same as the manufacturing processes of the LED having two cavities per normal package. The LED 41 which is obtained by doing so is mounted in the illumination device 31.

Furthermore, the dimming control unit 52 (refer to FIG. 15) generates the first PWM signal and the second PWM signal such that an intensity ratio between a peak wavelength of the red wavelength components of the first white light W1 and a peak wavelength of the red wavelength components of the second white light W2 is 50:50, outputs the first PWM signal to the constant current circuit 53, and outputs the second PWM signal to the constant current circuit 54. The constant current circuit 53 outputs a constant current based on the first PWM signal which is input from the dimming control unit 52 to the LED circuit 55. The constant current circuit 54 outputs a constant current based on the second PWM signal which is input from the dimming control unit 52 to the LED circuit 56.

In a case where the illumination device 1 is manufactured at the mixture ratio (weight %) of the phosphor described above, if the LED chip 43 and the LED chip 44 are illuminated in the same drive conditions as each other, the first white light W1 and the second white light W2 are emitted at a light intensity ratio of peak wavelength of 50:50. In this case, in the dimming control unit 52, if the first PWM signal and the second PWM signal have the same duty ratio and the LED drive signals which are output from the constant current circuits 53 and 54 are set to the same value, the intensity ratio of peak wavelength between the first white light W1 and the second white light W2 is 50:50.

In addition, it is needless to say that, even in a case where the mixture ratios of the phosphors are different from each other, if the duty ratio of the PWM signal or an LED drive current value is appropriately set, light intensity in which the intensity ratio of peak waveform between the first white light W1 and the second white light W2 is 50:50 can be realized in the same manner.

As described above, the light intensity ratio (peak ratio of light spectrum) between the KSF phosphor 15 and the CASN phosphor 16 in the LED 41 can be KSF:CASN=50:50.

(c) When the frequency (frame frequency) of the PWM signal is equal to or higher than 240 Hz If the frequency of the PWM signal is equal to or higher than 240 Hz, coloring phenomenon due to afterglow is hardly noticeable, and thus, only the KSF phosphor 15 can be used as a red phosphor, but it is more preferable that the KSF phosphor 15 and the CASN phosphor 16 which are combined together are used.

Reduction of coloring phenomenon such as a telop being displayed on a screen of a television which is caused by increasing the frequency of the PWM signal is due to the fact that an ON period in which three colors of blue, green, and red are output and an OFF period in which only the afterglow of red remains are shortened and an interval is also reduced. Accordingly, the following two reasons (1) and (2) are considered.

(1) Even though telops are displayed on a screen, if time in which only red afterglow is emitted is reduced, a width of an area in which afterglow color is shown in telop characters is reduced and it is difficult to view the telops.

(2) An interval in which an ON period during which three colors of blue, green, and red are output and an OFF period during which only afterglow of red remains are repeated is reduced, and thus, human eyes hardly see the color in a separated manner due to afterimage.

Generally, a display device which displays the television broadcast does not drive the frequency of the PWM signal at a frequency not more than 60 Hz.

CONCLUSION

The light emitting device according to aspect 1 of the present invention includes a light emitting element which emits primary light; a resin which seals the light emitting element; and first and second phosphors which are distributed in the resin, absorb part of the primary light, and emit secondary light having a wavelength longer than that of the primary light. The first phosphor absorbs the primary light and emits the secondary light by forbidden transition. The second phosphor absorbs the primary light and emits the secondary light by allowed transition.

According to the aforementioned configuration, the secondary light having a narrow width of peak wavelength of a light wavelength is obtained by the first phosphor. In addition, the secondary light having a fast response speed is obtained by the second phosphor. Accordingly, it is possible to obtain a light emitting device which emits the secondary light with high color purity and has a fast response speed.

The light emitting device according to aspect 2 of the present invention, in the aspect 1, may include a package in which only one cavity that is a concave portion is provided. The light emitting element may be disposed on a bottom surface in the cavity. The resin may be disposed in the cavity, and the first and second phosphors may be distributed in the resin. By using the configuration, it is possible to obtain a light emitting device which includes one cavity, emits the secondary light with high color purity, and has a fast response speed.

The light emitting device according to aspect 3 of the present invention, in the aspect 1, may include a package in which first and second cavities that are multiple concave portions are provided. The light emitting element may include a first light emitting element which is disposed on a bottom surface in the first cavity, and a second light emitting element which is disposed on a bottom surface in the second cavity. The resin may be disposed in the first and second cavities. The first phosphor may be distributed in the resin which is disposed in the first cavity. The second phosphor may be distributed in the resin which is disposed in the second cavity. By using the aforementioned configuration, it is possible to obtain a light emitting device which includes the first and second cavities that are multiple cavities, emits the secondary light with high color purity, and has a fast response speed.

According to the light emitting device of aspect 4 of the present invention, in the aspect 3, when a display panel which is illuminated by the light emitting device displays an image in a first mode, as a display mode of the display panel, of two of the first mode in which a clear image quality is required over a response speed and a second mode in which the response speed is required over the clear image quality, the first light emitting element may emit light having amount more than that of the second light emitting element. By using the aforementioned configuration, it is possible to display a clearer image.

According to the light emitting device of aspect 5 of the present invention, in the aspect 3, when a display panel which is illuminated by the light emitting device displays an image in a second mode, as a display mode of the display panel, of two of a first mode in which a clear image quality is required over a response speed and the second mode in which the response speed is required over the clear image quality, the second light emitting element may emit light having amount more than that of the first light emitting element. By using the aforementioned configuration, it is possible to display an image with faster response speed.

An illumination device according to aspect 6 of the present invention may include the light emitting device in the aspects 1 to 5. By using the aforementioned configuration, it is possible to obtain an illumination device which emits the secondary light with high color purity and has a fast response speed.

According to a light emitting device of another aspect of the present invention, in the aforementioned aspects, if a wavelength band of peak wavelength of the secondary light which is emitted from the first phosphor is equal to or less than 30 nm, and the time required for the intensity of the secondary light to become 1/e (e is a natural logarithm base) when the light emitting element extinguishes the primary light which is on is referred to as afterglow time, an afterglow time of the second phosphor may be equal to or less than 1/100 of an afterglow time of the first phosphor. By the aforementioned configuration, a light emitting device which emits the secondary light with high color purity and has a fast response speed can be obtained.

According to a light emitting device of still another aspect of the present invention, in the aforementioned aspects, the first phosphor may contain tetravalent manganese-activated fluoride tetravalent metal salt phosphor. By the aforementioned configuration, the first phosphor as an aspect can be obtained.

According to a light emitting device of still another aspect of the present invention, in the aforementioned aspects, the light emitting element may be a gallium nitride-based semiconductor which emits the primary light having a peak wavelength equal to or higher than 430 nm and equal to or shorter than 480 nm. By the aforementioned configuration, the light emitting element as an aspect can be obtained.

According to a light emitting device of still another aspect of the present invention, in the aforementioned aspects, the second phosphor may contain a divalent Eu-activated $CaAlSiN_3$ structure. By the aforementioned configuration, the second phosphor as an aspect can be obtained.

According to a light emitting module of still another aspect of the present invention, in the aforementioned aspects, may include the light emitting device and pulse width modulation signal generation means which generates a first pulse width modulation signal for making the first light emitting element emit light by pulse width modulation, and a second pulse width modulation signal for making the second light emitting element emit light by pulse width modulation.

By the aforementioned configuration, drive control of the first light emitting element and the second light emitting element can be independently made. Accordingly, it is possible to independently adjust intensity of mixture light of primary light from the first light emitting element and secondary light which is emitted from the first phosphor that absorbs the primary light, and intensity of mixture light of primary light from the second light emitting element and secondary light which is emitted from the second phosphor that absorbs the primary light. Accordingly, it is possible to obtain a light emitting module with wide color reproducibility and a fast response speed.

The present invention is not limited to the aforementioned each embodiment, various modifications can be made in a range described in the claims, and an embodiment which is obtained by appropriately combining technical means that are respectively disclosed in other embodiments is also included in a technical range of the present invention. Furthermore, it is possible to configure novel technical characteristics by combining the technical means which are respectively disclosed in each embodiment.

INDUSTRIAL APPLICABILITY

The present invention can be used for a light emitting device and an illumination device.

REFERENCE SIGNS LIST

1•31 ILLUMINATION DEVICE
5 LIGHT GUIDING PLATE
7•37 LIGHT SOURCE UNIT
11•41 LED (LIGHT EMITTING DEVICE)
12•42 PACKAGE
12a CAVITY
13 LED CHIP (LIGHT EMITTING ELEMENT)
14 RESIN
15 KSF PHOSPHOR (FIRST PHOSPHOR)
16 CASN PHOSPHOR (SECOND PHOSPHOR)
17 GREEN PHOSPHOR
21•51 LED DRIVE CONTROL UNIT
22•52 DIMMING CONTROL UNIT (PULSE WIDTH MODULATION SIGNAL GENERATION MEANS)
23 CONSTANT CURRENT CIRCUIT
25 LED CIRCUIT
42a FIRST CAVITY

42b SECOND CAVITY
42c PARTITION WALL
43 LED CHIP (FIRST LIGHT EMITTING ELEMENT)
44 LED CHIP (SECOND LIGHT EMITTING ELEMENT)
53·54 CONSTANT CURRENT CIRCUIT
55·56 LED CIRCUIT
W0 WHITE LIGHT
W1 FIRST WHITE LIGHT
W2 SECOND WHITE LIGHT
W4 WHITE LIGHT

The invention claimed is:

1. A light emitting device comprising:
a light emitting element which emits primary light;
a resin which seals the light emitting element;
first and second phosphors which are distributed in the resin, absorb a part of the primary light, and emit secondary light having a wavelength longer than that of the primary light; and
a package in which only one cavity that is a concave portion is provided,
wherein the first phosphor absorbs the primary light and emits the secondary light by forbidden transition,
wherein the second phosphor absorbs the primary light and emits the secondary light by allowed transition,
wherein the light emitting element is disposed on a bottom surface in the cavity,
wherein the resin is disposed in the cavity,
wherein a wavelength width of peak wavelength of a light spectrum of the secondary light emitted by the first phosphor is narrower than that of peak wavelength of a light spectrum of the secondary light emitted by the second phosphor, and
wherein a response speed of the second phosphor is faster than that of the first phosphor.

2. The light emitting device according to claim 1,
wherein the first phosphor is a phosphor having a narrow spectrum of a wavelength width of peak wavelength equal to or narrower than 30 nm.

3. The light emitting device according to claim 2,
wherein the first phosphor is a phosphor having a $Mn^{4+}$-activated $K_2SiF_6$ structure, and the second phosphor is a phosphor having a divalent Eu-activated $CaAlSiN_3$ structure.

4. The light emitting device according to claim 1, wherein intensity of the peak wavelength of the light spectrum of the secondary light emitted by the second phosphor accounts for not less than 25% and not more than 50% of a total of (i) intensity of the peak wavelength of the light spectrum of the secondary light emitted by the first phosphor and (ii) the intensity of the peak wavelength of the light spectrum of the secondary light emitted by the second phosphor.

5. The light emitting device according to claim 1, further comprising:
a green phosphor which is distributed in the resin, is excited by the primary light, and emits green secondary light.

6. A light emitting device comprising:
a light emitting element which emits primary light;
a resin which seals the light emitting element;
first and second phosphors which are distributed in the resin, absorb a part of the primary light, and emit secondary light having a wavelength longer than that of the primary light; and
a package in which first and second cavities that are multiple concave portions are provided,
wherein the first phosphor absorbs the primary light and emits the secondary light by forbidden transition,
wherein the second phosphor absorbs the primary light and emits the secondary light by allowed transition,
wherein the light emitting element includes a first light emitting element which is disposed on a bottom surface in the first cavity, and a second light emitting element which is disposed on a bottom surface in the second cavity,
wherein the resin is disposed in the first and second cavities,
wherein the first phosphor is distributed in the resin which is disposed in the first cavity, and
wherein the second phosphor is distributed in the resin which is disposed in the second cavity, and
wherein, when a display panel which is illuminated by the light emitting device displays an image in a first mode, as a display mode of the display panel, of two of the first mode in which a clear image quality is required over a response speed and a second mode in which the response speed is required over the clear image quality, the first light emitting element emits light having an amount of light more than that of the second light emitting element.

7. A light emitting device comprising:
a light emitting element which emits primary light;
a resin which seals the light emitting element;
first and second phosphors which are distributed in the resin, absorb a part of the primary light, and emit secondary light having a wavelength longer than that of the primary light; and
a package in which first and second cavities that are multiple concave portions are provided,
wherein the first phosphor absorbs the primary light and emits the secondary light by forbidden transition,
wherein the second phosphor absorbs the primary light and emits the secondary light by allowed transition,
wherein the light emitting element includes a first light emitting element which is disposed on a bottom surface in the first cavity, and a second light emitting element which is disposed on a bottom surface in the second cavity,
wherein the resin is disposed in the first and second cavities,
wherein the first phosphor is distributed in the resin which is disposed in the first cavity, and
wherein the second phosphor is distributed in the resin which is disposed in the second cavity, and
wherein, when a display panel which is illuminated by the light emitting device displays an image in a second mode, as a display mode of the display panel, of two of a first mode in which a clear image quality is required over a response speed and the second mode in which the response speed is required over the clear image quality, the second light emitting element emits light having an amount of light more than that of the first light emitting element.

8. An illumination device comprising:
the light emitting device according to claim 1.
9. An illumination device comprising:
the light emitting device according to claim 6.
10. An illumination device comprising:
the light emitting device according to claim 7.

* * * * *